(12) United States Patent
Endo

(10) Patent No.: US 10,991,859 B2
(45) Date of Patent: Apr. 27, 2021

(54) LIGHT-EMITTING DEVICE AND METHOD OF MANUFACTURING THE SAME

(71) Applicant: NICHIA CORPORATION, Anan (JP)

(72) Inventor: Shinya Endo, Yokohama (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 16/673,875

(22) Filed: Nov. 4, 2019

(65) Prior Publication Data

US 2020/0144466 A1 May 7, 2020

(30) Foreign Application Priority Data

Nov. 5, 2018 (JP) .............................. JP2018-208460

(51) Int. Cl.
| | | |
|---|---|---|
| *H01L 33/58* | (2010.01) | |
| *H01L 33/50* | (2010.01) | |
| *H01L 33/62* | (2010.01) | |
| *H01L 25/075* | (2006.01) | |
| *H01L 33/60* | (2010.01) | |

(52) U.S. Cl.
CPC .......... *H01L 33/58* (2013.01); *H01L 25/0753* (2013.01); *H01L 33/505* (2013.01); *H01L 33/507* (2013.01); *H01L 33/60* (2013.01); *H01L 33/62* (2013.01); *H01L 2933/0041* (2013.01); *H01L 2933/0058* (2013.01)

(58) Field of Classification Search
CPC ..... H01L 33/58; H01L 33/505; H01L 33/507; H01L 33/60; H01L 25/0753; H01L 2933/0041; H01L 2933/0058
See application file for complete search history.

(56) References Cited

U.S. PATENT DOCUMENTS

| | | | |
|---|---|---|---|
| 2012/0212962 A1* | 8/2012 | Yasumori | .............. C03C 14/004 |
| | | | 362/260 |
| 2015/0263254 A1 | 9/2015 | Miyoshi et al. | |

(Continued)

FOREIGN PATENT DOCUMENTS

| | | |
|---|---|---|
| JP | 2010-219324 | 9/2010 |
| JP | 2010-283281 | 12/2010 |

(Continued)

*Primary Examiner* — Feifei Yeung Lopez
(74) *Attorney, Agent, or Firm* — Mori & Ward, LLP

(57) ABSTRACT

A light-emitting device includes a light-emitting element; a first light-transmissive member bonded to the light-emitting element, containing a wavelength conversion member, and including a lower surface having an area larger than an upper surface of the light-emitting element; a second light-transmissive member bonded to an upper surface of the first light-transmissive member, including a lower surface having an area larger than the upper surface of the first light-transmissive member and having a periphery located outward of the upper surface of the first light-transmissive member, and an upper surface having an area smaller than the upper surface of the light-emitting element; a first light-guiding member over a lateral surface of the light-emitting element and the periphery of the lower surface of the first light-transmissive member; and a second light-guiding member over a lateral surface of the first light-transmissive member and the periphery of the lower surface of the second light-transmissive member.

18 Claims, 13 Drawing Sheets

(56) References Cited

U.S. PATENT DOCUMENTS

| | | | |
|---|---|---|---|
| 2016/0093777 A1* | 3/2016 | Sato | H01L 33/505 |
| | | | 257/98 |
| 2017/0062681 A1* | 3/2017 | Miyoshi | H01L 33/60 |
| 2018/0123005 A1 | 5/2018 | Ozeki et al. | |
| 2018/0233638 A1 | 8/2018 | Miyoshi et al. | |

FOREIGN PATENT DOCUMENTS

| | | |
|---|---|---|
| JP | WO2014/081042 | 5/2014 |
| JP | 2015-188069 | 10/2015 |
| JP | 2016-072515 | 5/2016 |
| JP | 2016-127145 | 7/2016 |
| JP | 2017-50359 | 3/2017 |
| JP | 2017-183427 | 10/2017 |
| JP | 2017-228604 | 12/2017 |
| JP | 2018-049875 | 3/2018 |
| JP | 2018-056552 | 4/2018 |
| JP | 2018-148075 | 9/2018 |
| JP | 2019-016763 | 1/2019 |
| WO | WO 2014/081042 | 5/2014 |

* cited by examiner

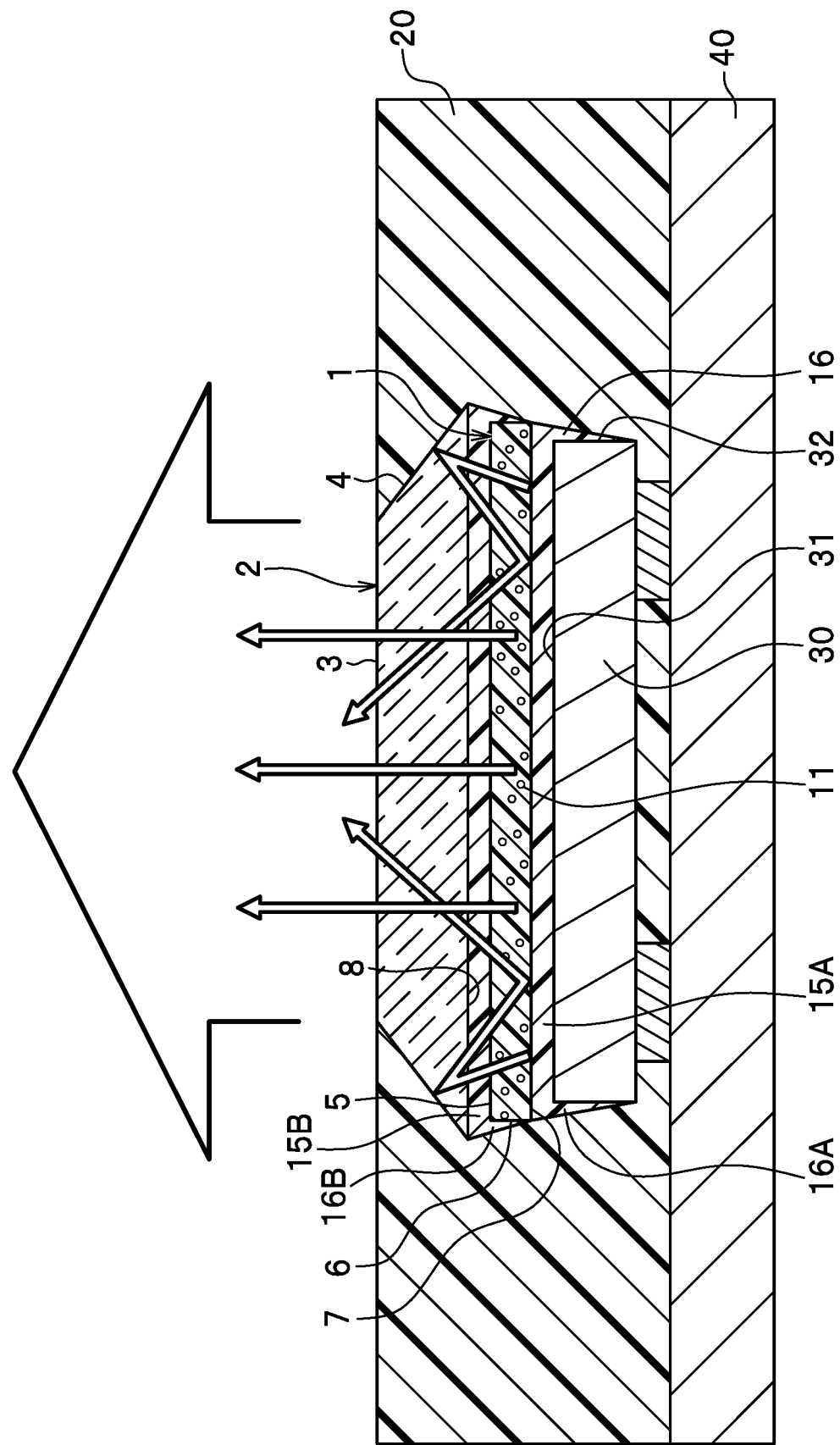

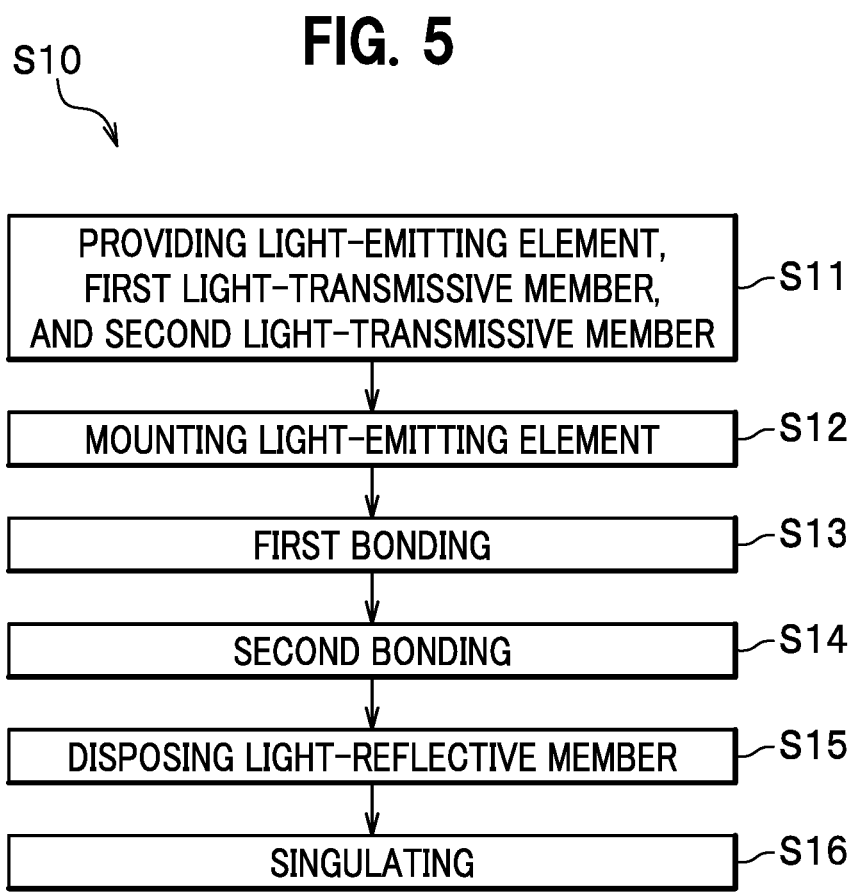

LIGHT-EMITTING DEVICE AND METHOD OF MANUFACTURING THE SAME

CROSS-REFERENCE TO RELATED APPLICATIONS

The present application claims priority under 35 U.S.C. § 119 to Japanese Patent Application No. 2018-208460, filed Nov. 5, 2018. The contents of this application are incorporated herein by reference in their entirety.

BACKGROUND OF THE INVENTION

1. Field of the Invention

The present disclosure relates to a light-emitting device and a method of manufacturing the same.

2. Description of Related Art

Light-emitting devices are often used for headlights of vehicles, and interior and exterior lighting. For example, a light-emitting device includes a circuit board, a light-emitting element mounted on or above an upper surface of the circuit board, a phosphor resin layer disposed on an upper surface of the light-emitting element, a diffusion resin layer disposed on an upper surface of the phosphor resin layer and diffusing light emitted from the light-emitting element, a first reflective member disposed on the upper surface of the circuit board and sealing lateral surfaces of the light-emitting element, and a second reflective member surrounding lateral surfaces of the diffusion resin layer (see WO 2014/081042).

SUMMARY OF THE INVENTION

In the light-emitting device described above, an area of the light-extracting surface is reduced to allow the intensity of light to be increased, but light emitted laterally from the light-emitting element may not be efficiently guided to the upper surface.

Accordingly, there is a need for a light-emitting device with a higher luminance and a method of manufacturing the same, as are provided herein.

A light-emitting device according to one embodiment includes at least one light-emitting element having an upper surface and at least one lateral surface; a first light-transmissive member bonded to the upper surface of the light-emitting element, the first light-transmissive member containing a wavelength conversion member and including: an upper surface, at least one lateral surface, and a lower surface having an area larger than an area of the upper surface of the light-emitting element and having a periphery located outward of the upper surface of the light-emitting element; a second light-transmissive member bonded to the upper surface of the first light-transmissive member and including: a lower surface having an area larger than an area of the upper surface of the first light-transmissive member and having a periphery located outward of the upper surface of the first light-transmissive member, and an upper surface having an area smaller than an area of the upper surface of the light-emitting element; a first light-guiding member disposed over the at least one lateral surface of the light-emitting element and the periphery of the lower surface of the first light-transmissive member; and a second light-guiding member disposed over the at least one lateral surface of the first light-transmissive member and the periphery of the lower surface of the second light-transmissive member.

A method of manufacturing a light-emitting device according to one embodiment includes providing at least one light-emitting element including an upper surface and at least one lateral surface, a first light-transmissive member containing a wavelength conversion member and including an upper surface, at least one lateral surface, and a lower surface that has an area larger than an area of the upper surface of the light-emitting element, and a second light-transmissive member including a lower surface that has an area larger than an area of the upper surface of the first light-transmissive member and including an upper surface having an area smaller than an area of the upper surface of the light-emitting element; bonding the first light-transmissive member to the upper surface of the light-emitting element via a first light-guiding member such that the first light-guiding member is disposed over the at least one lateral surface of the light-emitting element and a periphery of the lower surface of the first light-transmissive member; and bonding the second light-transmissive member to the upper surface of the first light-transmissive member via a second light-guiding member such that the second light-guiding member is disposed over the at least one lateral surface of the first light-transmissive member and a periphery of the lower surface of the second light-transmissive member.

A method of manufacturing a light-emitting device according to one embodiment includes providing at least one light-emitting element including an upper surface and at least one lateral surface, a first light-transmissive member containing a wavelength conversion member and including an upper surface, at least one lateral surface, and a lower surface that has an area larger than an area of the upper surface of the light-emitting element, and a second light-transmissive member including a lower surface that has an area larger than an area of the upper surface of the first light-transmissive member and including an upper surface having an area smaller than an area of the upper surface of the light-emitting element; directly bonding the upper surface of the first light-transmissive member and the lower surface of the second light-transmissive member; directly bonding the lower surface of the first light-transmissive member and the upper surface of the light-emitting element such that a periphery of the lower surface of the first light-transmissive member is located outward of a periphery of the upper surface of the light-emitting element; disposing a second light-guiding member over the at least one lateral surface of the first light-transmissive member and a periphery of the lower surface of the second light-transmissive member; and disposing a first light-guiding member over the at least one lateral surface of the light-emitting element and the periphery of the lower surface of the first light-transmissive member.

A light-emitting device according to certain embodiments allow irradiation of light with a higher luminance. A method of manufacturing a light-emitting device according to certain embodiments allow for obtaining a high-luminance light-emitting device.

BRIEF DESCRIPTION OF THE DRAWINGS

FIG. 4 is a schematic sectional view for illustrating emission of light from the light-emitting device according to the first embodiment.

FIG. 5 is a flowchart illustrating a method of manufacturing the light-emitting device according to the first embodiment.

DETAILED DESCRIPTION OF EMBODIMENT

Figure 1:
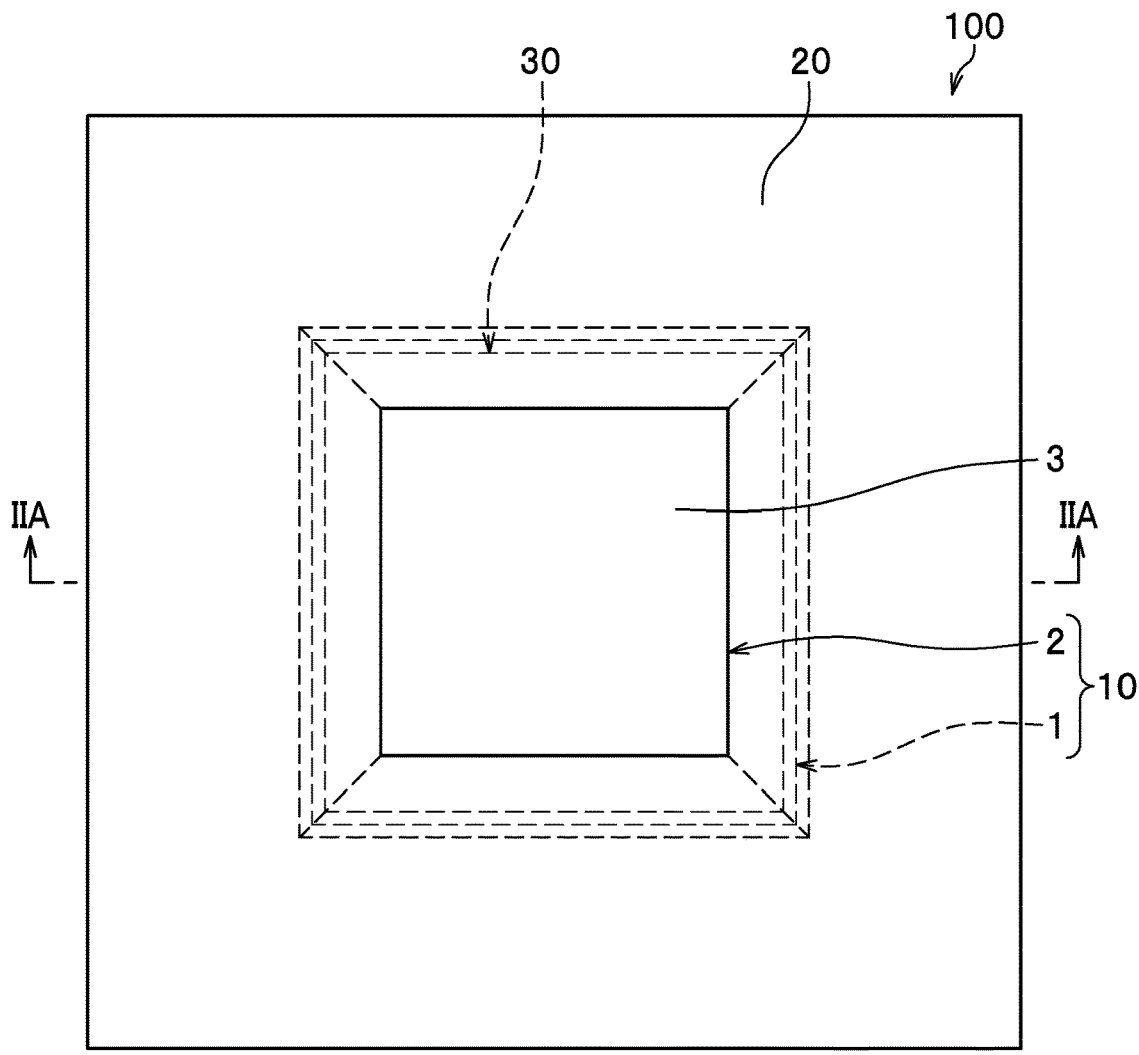
FIG. 1 is a schematic plan view of a light-emitting device according to a first embodiment.

A light-emitting device according to certain embodiments will be described below referring to the drawings. The drawings referred to in the descriptions below schematically illustrate certain embodiments. The scales, the distances, the positional relations, and the like of members may be exaggerated, or illustration of a portion of the members may be omitted. In the descriptions below, the same term or reference numeral generally represents the same member or a member made of the same material, and its detailed description will be omitted as appropriate. Furthermore, a direction in each drawing is not intended to indicate an absolute direction but represents a relative direction between components.

Structure of Light-Emitting Device

One example of a structure of the light-emitting device according to a first embodiment will be described referring to FIG. 1 to FIG. 4. FIG. 2B is an enlarged view for illustrating a cross-sectional shape, but hatching for indicating the section is omitted to clearly show leader lines, etc.

Figure 3:
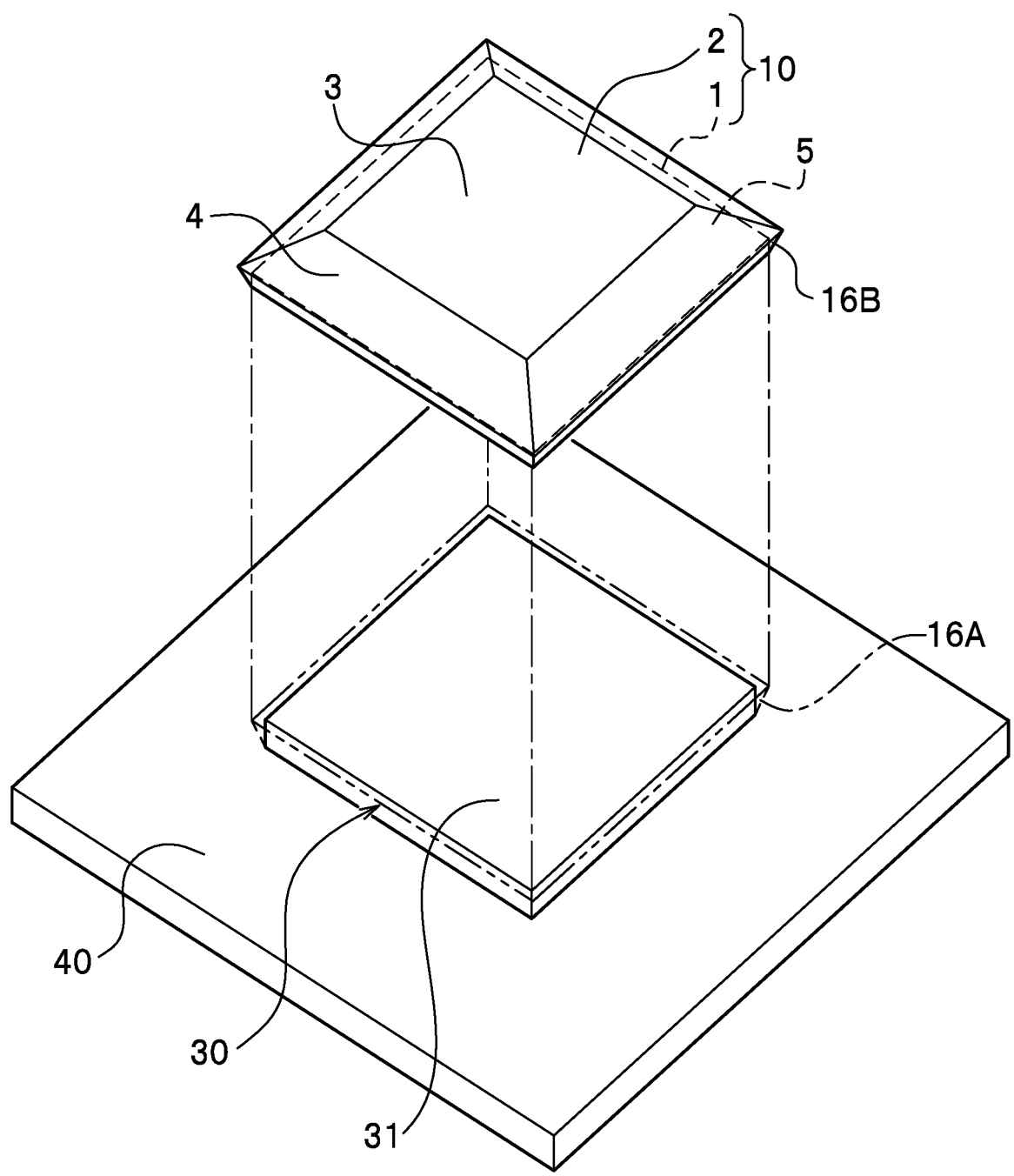
FIG. 3 is a schematic exploded perspective view of a second light-transmissive member of the light-emitting device according to the first embodiment.

A light-emitting device 100 includes a light-emitting element 30 having an upper surface 31, a first light-transmissive member 1 bonded to an upper surface 31 of the light-emitting element 30, containing a wavelength conversion member 11, and having a lower surface 7 having a periphery located outward of the upper surface 31 of the light-emitting element 30 and having an area larger than an area of the upper surface 31 of the light-emitting element 30, a second light-transmissive member 2 bonded to an upper surface 5 of the first light-transmissive member 1 and having a lower surface 8 having a periphery located outward of the upper surface 5 of the first light-transmissive member and having an area larger than an area of the upper surface 5 of the first light-transmissive member 1 and an upper surface 3 having an area smaller than an area of the upper surface 31 of the light-emitting element 30, a first light-guiding member 15A disposed over lateral surfaces 32 of the light-emitting element 30 and the periphery of the lower surface of the first light-transmissive member 1, and a second light-guiding member 15B disposed over lateral surfaces 6 of the first light-transmissive member 1 and the periphery of the lower surface of the second light-transmissive member 2. FIG. 3 shows a state where the light-emitting element 30 is mounted on or above a substrate 40 without a light-reflective member 20 being formed and where a light-transmissive member unit 10 is disposed on or above the light-emitting element 30. The following describes the structure of the light-emitting device 100.

Light-Emitting Element

The light-emitting element 30 is flip-chip mounted on conductive wirings of the substrate 40 with bonding members disposed between the light-emitting element 30 and the conductive wirings. The light-emitting element 30 includes a plurality of electrodes on the same surface side. In the light-emitting element 30, a surface at which the plurality of electrodes are disposed is referred to as a "lower surface", and the upper surface 31 opposite to the lower surface serves as a main light-extracting surface. A known light-emitting element can be used for the light-emitting element 30. For example, a light-emitting diode or a laser diode is preferable. A light-emitting element with any appropriate emission wavelength can be selected as the light-emitting element 30. Examples of a blue or green light-emitting element include a light-emitting element including a nitride-based semiconductor ($In_XAl_YGa_{1-X-Y}N$, where $0 \leq X$, $0 \leq Y$, and $X+Y \leq 1$) or GaP. For a red light-emitting element, a nitride-based semiconductor, or GaAlAs, AlInGaP, or the like can be used. A semiconductor light-emitting element made of materials other than materials described above can also be used for the light-emitting element 30. The composition, emission color, size, shape, and number of the light-emitting element 30 can be selected appropriately according to the purpose.

The light-emitting element 30 preferably includes positive and negative electrodes on the same surface side. This structure allows the light-emitting element 30 to be flip-chip mounted on the substrate 40. In this case, the surface opposite to the surface at which the plurality of electrodes are disposed serves as the main light-extracting surface of the light-emitting element. In the case in which the light-emitting element 30 is face-up mounted on the substrate 40, the surface at which the plurality of electrodes are disposed serves as the main light-extracting surface of the light-emitting element 30. The light-emitting element 30 is electrically connected to the substrate 40 via bonding members such as bumps.

Light-Transmissive Member Unit

The light-transmissive member unit 10 is bonded to the upper surface 31 of the light-emitting element 30 in the light-emitting device 100. The light-transmissive member unit 10 includes the first light-transmissive member 1 and the second light-transmissive member 2 each having the upper surface and the lower surface. The upper surface 5 of the first light-transmissive member and the lower surface 8 of the second light-transmissive member are bonded together to constitute the light-transmissive member unit 10. For example, in the light-transmissive member unit 10, the first light-transmissive member 1 is a light-transmissive plate containing the wavelength conversion member 11, and the second light-transmissive member 2 is a light-transmissive plate that does not contain the wavelength conversion member 11. The light-transmissive member unit 10 has a protruding shape in which the upper surface 3 of the second light-transmissive member 2 has an area smaller than an area of the lower surface 7 of the first light-transmissive member 1, and the lateral surfaces 6 of the first light-transmissive member 1 are located inward of an outermost periphery of lateral surfaces 4 of the second light-transmissive member 2 in a plan view. The light-transmissive member unit 10 can have a thickness in a range of, for example, 60 μm to 1,000 μm. The thickness of the second light-transmissive member 2 is preferably, for example, 50% to 90% of the thickness of the light-transmissive member unit 10.

First Light-Transmissive Member

The first light-transmissive member 1 is bonded to the upper surface 31 of the light-emitting element 30. The first light-transmissive member 1 contains the wavelength conversion member 11 (see FIG. 4) and contains an inorganic material as a main component. For example, glass containing the wavelength conversion member 11 can be used for the first light-transmissive member 1. The first light-transmissive member 1 has, for example, a flat plate shape having the upper surface 5, the lower surface 7 opposite to the upper surface 5, and the lateral surfaces 6 connected to the upper surface 5 and the lower surface 7.

Light emitted from at least one light-emitting element 30 included in the light-emitting device 100 is incident on the lower surface 7 of the first light-transmissive member. The lower surface 7 has an area larger than the sum of the areas of the upper surfaces 31 of one or more light-emitting elements 30 bonded to the lower surface 7. The lower surface 7 of the first light-transmissive member is substantially flat.

The first light-transmissive member 1 can have an appropriate shape in a plan view according to the shape, number, and arrangement of the light-emitting element described below. Examples of the shape of the first light-transmissive member 1 in a plan view include circles, ellipses, polygons, and other shapes close to these shapes. Among these shapes, a shape corresponding to the outer peripheral shape of the light-emitting element 30 (for example, both substantially rectangular shapes) is preferable. The shapes of the first light-transmissive member 1 and the second light-transmissive member 2 in a plan view can be substantially similar or can be different.

The upper surface 5 of the first light-transmissive member is substantially parallel to the lower surface 7 and has an area smaller than an area of the lower surface 8 of the second light-transmissive member. The lateral surfaces 6 of the first light-transmissive member are substantially perpendicular to the lower surface 7 of the first light-transmissive member. With the lateral surfaces 6 substantially perpendicular to the lower surface 7, the first light-guiding member 15A can be prevented from creeping up the lateral surfaces 6, when using the first light-guiding member 15A serving as an adhesive material that bonds the first light-transmissive member 1 to the light-emitting element 30 in manufacturing of the light-emitting device 100. Preventing creep-up of the first light-guiding member 15A on the lateral surfaces 6 allows for preventing light emitted from the light-emitting element 30 from leaking out without passing through the first light-transmissive member 1.

The lower surface 7 of the first light-transmissive member is larger than the upper surface 31 of the light-emitting element 30, such that the entirety of the upper surface 31 of the light-emitting element 30 is located inward of a periphery of the lower surface 7 of the first light-transmissive member in a plan view and the lower surface 7 of the first light-transmissive member faces the upper surface 31 of the light-emitting element 30. In other words, the periphery of the lower surface 7 of the first light-transmissive member is located outward of the periphery of the upper surface 31 of the light-emitting element 30 in a plan view. With the first light-transmissive member having the lower surface 7 with an area larger than an area of the upper surface 31 of the light-emitting element 30, light emitted from the light-emitting element 30 can be incident on the first light-transmissive member 1 with reduction in loss of the light. The lower surface 7 of the first light-transmissive member has an area in the range of, for example, 105% to 150% of the sum of the areas of the upper surfaces 31 of one or more light-emitting elements 30 bonded to the lower surface 7. Light emitted from the light-emitting element 30 is incident on the first light-transmissive member 1 through the lower surface 7, travels toward the upper surface 5, and is incident on the second light-transmissive member 2 through the lower surface 8 of the second light-transmissive member.

Examples of the inorganic material used for the first light-transmissive member 1 include glass such as borosilicate glass, quartz glass, sapphire glass, calcium fluoride glass, aluminoborosilicate glass, oxynitride glass, and chalcogenide glass.

For the wavelength conversion member 11, an appropriate phosphor used in the light-emitting device field can be selected. In the case in which a phosphor is used for the wavelength conversion member 11, for example, phosphor-containing glass, a phosphor-containing ceramic, or a sintered body of the phosphor can be used for the first light-transmissive member 1. Specific examples of the phosphor include cerium-activated yttrium-aluminum-garnet based phosphors (YAG:Ce); cerium-activated lutetium-aluminum-garnet based phosphors (LAG:Ce); europium- and/or chromium-activated nitrogen-containing calcium aluminosilicate based phosphors ($CaO-Al_2O_3-SiO_2$:Eu, Cr); europium-activated silicate based phosphors (($Sr,Ba)_2SiO_4$: Eu); nitride based phosphors such as β-SiAlON phosphors, $CaAlSiN_3$:Eu (CASN based phosphors), and $(Sr,Ca)AlSiN_3$: Eu (SCASN based phosphors); $K_2SiF_6$:Mn (KSF based phosphors); sulfide based phosphors; and quantum-dot phosphors.

Various emission colors can be obtained by combining the phosphor with a blue-light emitting element or an ultraviolet-light emitting element. When the light-emitting device 100 is configured to emit white light, type and concentration of the wavelength conversion member 11 contained in the first light-transmissive member 1 are adjusted so that white light is obtained. The concentration of the wavelength conversion member 11 contained in the first light-transmissive member 1 is, for example, approximately in a range of 30% by mass to 80% by mass.

The first light-transmissive member 1 can further contain a light-diffusing material. Examples of the light-diffusing material include titanium oxide, barium titanate, aluminum oxide, and silicon oxide. In the first light-transmissive member 1, the wavelength conversion member 11 can be dispersed throughout the first light-transmissive member 1 or can be dispersed predominantly at the upper surface side or lower surface side of the first light-transmissive member 1.

Second Light-Transmissive Member

The second light-transmissive member 2 is bonded to the first light-transmissive member 1. The second light-transmissive member 2 contains an inorganic material as a main component. For example, glass can be used for the second light-transmissive member 2. For example, the second light-transmissive member 2 has the upper surface 3, the lower surface 8 opposite to the upper surface 3, and the lateral surface 4 in contact with the upper surface 3 and the lower surface 8, and the upper surface 3 of the second light-transmissive member 2 has an area smaller than an area of the lower surface 8. The lower surface 8 of the second light-transmissive member is larger in area than the upper surface 5 of the first light-transmissive member. That is, the periphery of the lower surface 8 of the second light-transmissive member 2 is located outward of the periphery of the upper surface 5 of the first light-transmissive member in a plan view, and the periphery of the upper surface 3 of the second light-transmissive member is located inward of the periphery of the upper surface 5 of the first light-transmissive member in a plan view. The area of the upper surface 3 of the second light-transmissive member is preferably smaller than the sum of the areas of the upper surfaces 31 of one or more light-emitting elements 30 included in the light-emitting device 100. Further, the area of the upper surface 3 of the second light-transmissive member is preferably 70% or less, more preferably 50% or less, further preferably 30%, of the area of the lower surface 7 of the first light-transmissive member. With the second light-transmissive member having the upper surface 3 having an area smaller than the area of the lower surface 7 of the first light-transmissive member as described above, light that has been emitted from the light-emitting element 30 and incident on the lower surface 7 of the first light-transmissive member is emitted through the upper surface 3 of the second light-transmissive member (light-extracting surface of the light-emitting device 100) having an area smaller than the area of the upper surface 31 of the light-emitting element 30. In other words, the area of the light-extracting surface is reduced due to the structure of the second light-transmissive member 2, so that the light-emitting device 100 can have a higher luminance and illuminate a more distant location.

It is preferable that the lateral surfaces 4 of the second light-transmissive member be inclined with respect to the lower surface 8 of the second light-transmissive member. The lateral surfaces 4 are inclined at a predetermined angle between the lateral surfaces 4 and the lower surface 8 toward the upper surface 3 of the second light-transmissive member, so that the light-reflective member 20 covering the lateral surface 4 can reflect light, allowing increase of the light extraction efficiency. For example, the lateral surfaces 4 of the second light-transmissive member is preferably at an angle of 10° or greater and 85° or less relative to the lower surface 8. With the lateral surfaces 4 of the second light-transmissive member at an angle greater than 85°, it is difficult to cause the upper surface 3 of the second light-transmissive member to be smaller than the upper surface 31 of the light-emitting element 30, and extraction of light with a higher luminance is difficult. If the lateral surfaces 4 of the second light-transmissive member is at an angle smaller than 10°, the area of the lower surface 8 of the second light-transmissive member is required to be increased, which leads to difficulty in control of the balance between the sizes of the second light-transmissive member and the first light-transmissive member 1. The lateral surfaces 4 of the second light-transmissive member is preferably provided with a metal film. The combination of the metal film disposed on the lateral surface 4 and the light-reflective member 20 allows for increasing a reflectance of light transmitted from the lower surface 8 of the second light-transmissive member and increasing the efficiency of extraction of light to the outside from the upper surface 3 of the second light-transmissive member. The metal film disposed on the lateral surface 4 enhances the contrast with the upper surface 3 of the second light-transmissive member.

The second light-transmissive member 2 preferably has a thickness of, for example, equal to or larger than the thickness of the first light-transmissive member 1. The second light-transmissive member 2 has a thickness in a range of, for example, approximately 30 μm to 900 μm. Examples of the glass material used for the second light-transmissive member 2 include borosilicate glass, quartz glass, sapphire glass, calcium fluoride glass, aluminoborosilicate glass, oxynitride glass, and chalcogenide glass. The second light-transmissive member 2 can be provided with a reflective film, such as a metal film, and an anti-reflection film such as an anti-reflection coating (AR coating). It is preferable that a metal film be disposed on the lateral surfaces 4 of the second light-transmissive member and that a film, such as an AR coating, which allows for reducing loss of light and enhances the transmittance be disposed on the upper surface 3 of the second light-transmissive member. The second light-transmissive member 2 preferably has a refractive index close to the refractive index of the first light-transmissive member 1.

Bonding between the first light-transmissive member 1 and the light-emitting element 30 and bonding between the first light-transmissive member 1 and the second light-transmissive member 2 can be performed by adhering using a known adhesive material such as epoxy resins and silicone resins, adhering using an organic adhesive material having a high refractive index, or adhering using low-melting-point glass, but is preferably performed by direct-bonding without bonding members such as an adhesive material. The first light-transmissive member 1 and the second light-transmissive member 2 are both mainly made of an inorganic material and can be directly bonded using, for example, pressure-bonding, sintering, surface-activated bonding, atomic diffusion bonding, or hydroxy-group bonding. Directly bonding the first light-transmissive member 1 and the second light-transmissive member 2 that are made of the same material allows for reducing reflection caused due to difference in the refractive indices, so that the light extraction efficiency can be increased.

For example, using an inorganic material such as a glass plate for the second light-transmissive member 2 allows for reducing the thermal resistance compared with the case in which a resin material is used. Accordingly, deterioration over time of the emitting surface due to long-term use can be reduced in the light-emitting device 100, in which the second light-transmissive member 2 has a structure such that the emission area of light emitted from the light-emitting element is reduced to increase luminance.

Figure 2A:
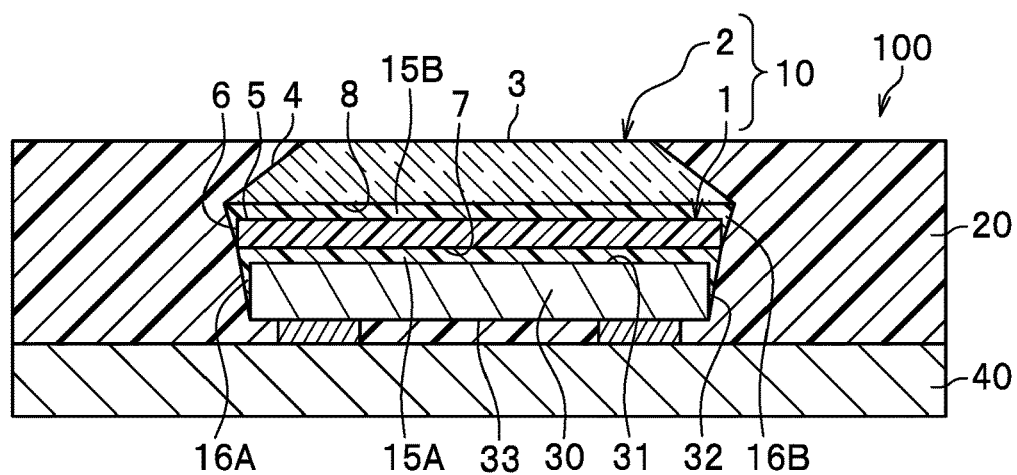
FIG. 2A is a schematic sectional view of the light-emitting device in FIG. 1 taken along the line IIA-IIA.
Figure 2B:
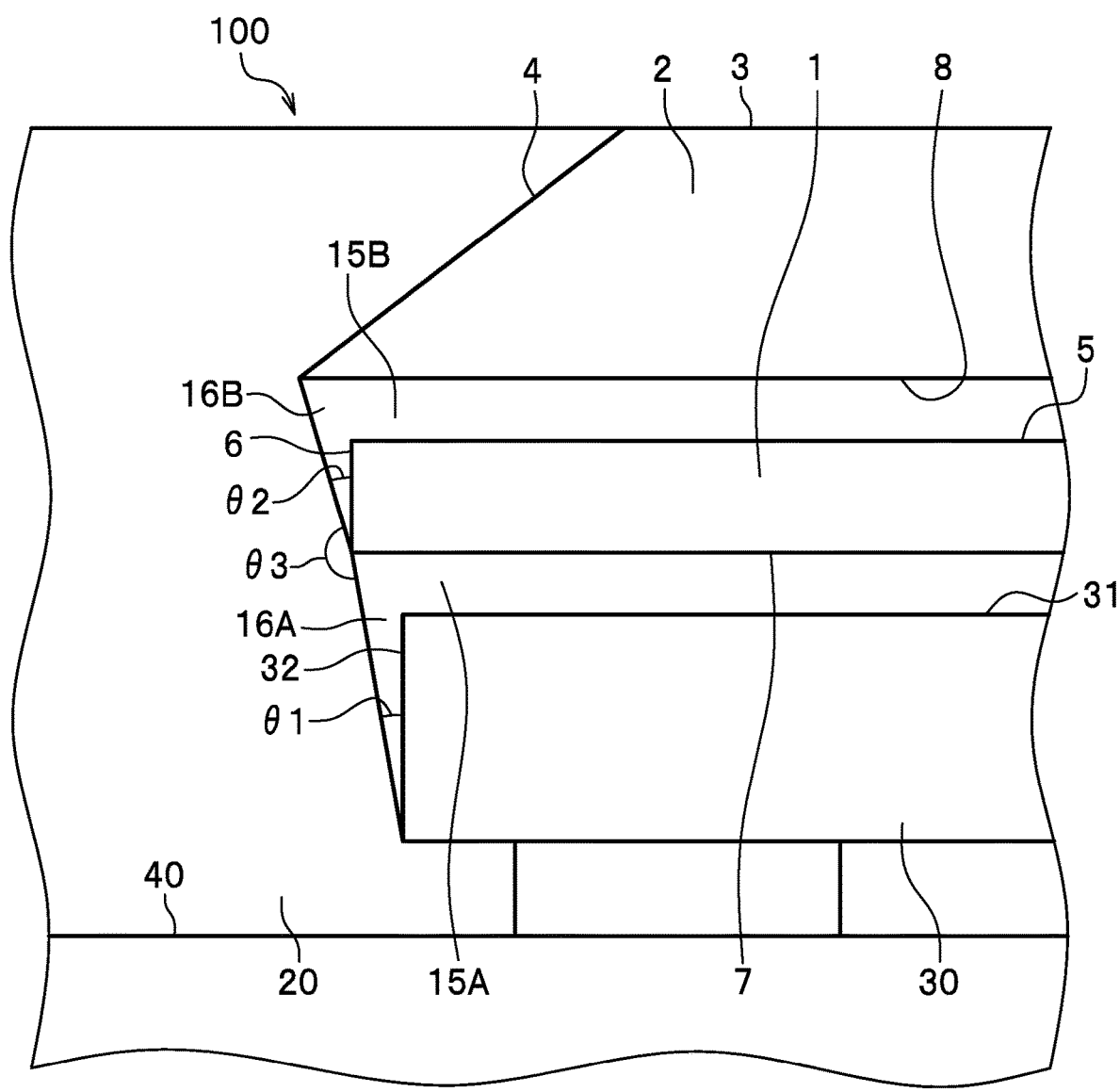
FIG. 2B is a schematic enlarged view of a portion of FIG. 2A.

The light-emitting device 100 shown in FIG. 1 to FIG. 3 is an example in which the first light-transmissive member 1 is bonded to the light-emitting element 30 and the second light-transmissive member 2 using the first light-guiding member 15A and the second light-guiding member 15B, respectively, as adhesive materials.

First Light-Guiding Member and Second Light-Guiding Member

The light-emitting element 30 and the light-transmissive member unit 10 can be bonded together using, for example, the first light-guiding member 15A as an adhesive material. The first light-guiding member 15A is continuously disposed over the upper surface 31 and at least a portion of the lateral surfaces 32 of the light-emitting element 30. In the case in which the first light-guiding member 15A is disposed over the lateral surfaces 32 of the light-emitting element 30, the first light-guiding member 15A is disposed between the light-reflective member 20 and the lateral surfaces 32 of the light-emitting element 30. The first light-guiding member 15A has an upper surface located between the light-reflective member 20 and the lateral surfaces 32 of the light-emitting element 30 is in contact with the lower surface 7 of the first light-transmissive member. In the case in which the first light-guiding member 15A is used as a bonding member that bonds the light-emitting element 30 and the light-transmissive member unit 10 together, light emitted from the light-emitting element 30 propagates through the first light-guiding member 15A to the lower surface of the light-transmissive member unit 10. Accordingly, a member that can effectively guide light emitted from the light-emitting element 30 to the light-transmissive member unit 10 is preferably used for the first light-guiding member 15A. Examples of such a material having a good light-guiding property and adhesiveness used for the first light-guiding member 15A include known resin materials such as epoxy resins and silicone resins, organic adhesive materials with high refractive indices, inorganic adhesive materials, and adhesive materials employing low-melting-point glass. The first light-guiding member 15A preferably extends from the upper surface 31 to the lateral surfaces 32 of the light-emitting element 30 to form a first fillet 16A. The first fillet 16A is preferably in contact with both of the lower surface 7 of the first light-transmissive member and the lateral surfaces 32 of the light-emitting element 30 and preferably has a curved surface recessed toward the light-reflective member 20. This shape allows light emitted from the light-emitting element 30 to be reflected by the fillet surface of the first light-guiding member 15A and to be easily guided to the first light-transmissive member 1.

The first light-transmissive member 1 and the second light-transmissive member 2 can be bonded together using, for example, the second light-guiding member 15B as an adhesive material. The second light-guiding member 15B is continuously disposed over the upper surface 5 and at least a portion of the lateral surfaces 6 of the first light-transmissive member 1. In the case in which the second light-guiding member 15B is disposed over the lateral surface 6 of the first light-transmissive member 1, the second light-guiding member 15B is disposed between the light-reflective member 20 and the lateral surfaces 6 of the first light-transmissive member 1. The second light-guiding member 15B has an upper surface located between the light-reflective member 20 and the lateral surfaces 6 of the first light-transmissive member 1 is in contact with the lower surface 8 of the second light-transmissive member. In the case in which the second light-guiding member 15B is used as a bonding member that bonds the first light-transmissive member 1 and the second light-transmissive member 2 together, light transmitted from the first light-transmissive member 1 propagates through the second light-guiding member 15B to the lower surface of the second light-transmissive member 2. Accordingly, a member that can effectively guide light emitted from the light-emitting element 30 from the first light-transmissive member 1 to the second light-transmissive member 2 is preferably used for the second light-guiding member 15B. A material having a good light-guiding property and adhesiveness similar to the above-described material used for the first light-guiding member 15A can be used for the second light-guiding member 15B. The second light-guiding member 15B preferably extends from the upper surface 5 to the lateral surface 6 of the first light-transmissive member 1, to form a second fillet 16B. The second fillet 16B is preferably in contact with both the lower surface 8 of the second light-transmissive member and the lateral surfaces 6 of the first light-transmissive member, and has a curved surface recessed toward the light-reflective member 20. This shape allows light emitted from the light-emitting element 30 to be reflected by the fillet surface of the second light-guiding member 15B and to be easily guided to the second light-transmissive member 2.

Each of the first fillet 16A and the second fillet 16B has a substantially triangular shape in a cross-sectional view. The upper end of the substantially triangular first fillet 16A can be spaced apart from the lower end of the second fillet 16B in a cross-sectional view, but the upper end of the first fillet 16A and the lower end of the second fillet 16B are preferably in contact with each other (the upper end of the first fillet 16A and the lower end of the second fillet 16B are in contact with each other in FIG. 2B). The luminance can be enhanced by reducing an angle θ1 defined by an inclined surface that is the interface between the first fillet 16A and the light-reflective member 20 and the lateral surface 32 of the light-emitting element 30 in a cross-sectional view and an angle θ2 defined by an inclined surface that is the interface between the second fillet 16B and the light-reflective member 20 and the lateral surface 6 of the first light-transmissive member in a cross-sectional view, and the luminous flux can be increased by increasing the angles θ1 and θ2. In other words, adjustment of the angle θ1 and the angle θ2 allows for obtaining desired optical characteristics. It is desirable that the angle defined by these inclined surfaces is in the range of 180°±45°. As used herein, inclined surfaces forming a continuous straight line with the angles θ1 and θ2 of the same degree are referred to as being at 180°. In other words, when the inclined surface of the first fillet 16A and the inclined surface of the second fillet 16B form a flat surface, an angle θ3 (see FIG. 2B) defined by the inclined surface of the first fillet 16A and the inclined surface of the second fillet 16B is referred to as being 180°, and the angle θ3 in the range of 180°±45° allows light emitted from the light-emitting element 30 to be efficiently reflected by the light-reflective member 20 and to travel to the upper surface 3 of the second light-transmissive member.

Light-Reflective Member

As shown in FIG. 1, FIG. 2A, FIG. 2B, and FIG. 4, the light-reflective member 20 reflects light traveling in directions other than the direction toward the upper surface 3 of the second light-transmissive member so as to cause the light to be emitted from the upper surface 3 of the second light-transmissive member, and covers the lateral surfaces of the light-emitting element 30 to protect the light-emitting element 30 against external force, dust, and gas. The light-reflective member 20 partially covers the light-transmissive member unit 10, the light-emitting element 30, and the upper surface of the substrate 40 such that the upper surface 3 of the light-transmissive member unit 10 (in other words, the upper surface 3 of the second light-transmissive member) is exposed to serve as the light-extracting surface of the light-emitting device 100. More specifically, the light-reflective member 20 covers the lateral surfaces 4 of the second light-transmissive member, the lateral surface of the first light-transmissive member 1, and the lateral surface 32 and a lower surface 33 of the light-emitting element 30. In this case, the light-reflective member 20 covers the lateral surfaces 32 of the light-emitting element 30 such that the first fillet 16A of the first light-guiding member 15A is disposed between the light-reflective member 20 and the lateral surfaces 32 of the light-emitting element 30. The light-reflective member 20 also covers the lateral surfaces 6 of the first light-transmissive member 1 such that the second fillet 16B of the second light-guiding member 15B is disposed between the light-reflective member 20 and the lateral surfaces 6 of the first light-transmissive member 1. With the light-extracting surface of the light-emitting element 30 not covered with the light-reflective member 20 and bonded to the lower surface 7 of the first light-transmissive member, light can be incident on the light-transmissive member unit 10. The light-reflective member 20 is made of a member that can reflect light emitted from the light-emitting element 30 and allows light emitted from the light-emitting element 30 to be reflected at the interface between the light-transmissive member unit 10 and the light-reflective member 20, so that the light enters the light-transmissive member unit 10. As described above, light emitted from the light-emitting element 30 is reflected by the light-reflective member 20, passes through the light-transmissive member unit 10, and is emitted to the outside from the upper surface 3 of the second light-transmissive member serving as the light-extracting surface of the light-emitting device 100.

The upper surface of the light-reflective member 20 is preferably located at the same height as or located at a position lower than a position of the upper surface 3 of the second light-transmissive member. Light emitted from the upper surface 3 of the second light-transmissive member serving as the emission surface of the light-emitting device 100 also spreads in the lateral direction. Accordingly, if the upper surface of the light-reflective member 20 is located at a higher position than the upper surface 3 of the second light-transmissive member, light emitted from the upper surface 3 of the second light-transmissive member is reflected by the upper surface of the light-reflective member 20 located at a higher position than the upper surface 3 of the second light-transmissive member, which may cause unevenness in the light distribution. In view of this, the light-reflective member 20 covers the lateral surfaces 4 of the second light-transmissive member, and the upper surface of the light-reflective member 20 is located at the same height as or located at a position lower than a position of the upper surface 3 of the second light-transmissive member. This structure allows light emitted from the light-emitting element 30 to be efficiently extracted out of the light-emitting device 100, and thus is preferable.

For the light-reflective member 20, a base material containing a light-reflective substance and made of a silicone resin, a modified silicone resin, an epoxy resin, a modified epoxy resin, an acrylic resin, or a hybrid resin containing at least one of these resins can be used. Titanium oxide, silicon oxide, zirconium oxide, yttrium oxide, yttria-stabilized zirconia, potassium titanate, alumina, aluminum nitride, boron nitride, mullite, or the like can be used as the light-reflective substance. Amounts of reflection and transmission of light by the light-reflective member 20 vary according to on the concentration and density of the light-reflective substance, and accordingly the concentration and density can be appropriately adjusted in accordance with the shape and size of the light-emitting device 100. Using a light-reflective and heat-dissipating material for the light-reflective member 20 allows for improving heat dissipation performance of the light-reflective member 20 while having the light-reflecting property. Examples of such a material include aluminum nitride and boron nitride, which have high thermal conductivities. Members made of different materials can be used in combination for the light-reflective member 20. For example, different light-reflective members 20 can be used for a portion corresponding to the height of the light-emitting element 30 and a portion between the light-emitting element 30 and the light-transmissive member unit 10.

Substrate

At least one light-emitting element 30 is mounted above the substrate 40, and the substrate 40 electrically connects the light-emitting device 100 to an external device. The substrate 40 includes a flat plate-shaped supporting member and conductor wirings disposed on a surface(s) of and/or inside the flat plate-shaped supporting member. The shape, size, and other structural factors of electrodes of the substrate 40 are selected in accordance with the constitution and size of the electrodes of the light-emitting element 30.

An insulating material that hardly transmits light emitted from the light-emitting element 30 and extraneous light is preferably used for the supporting member of the substrate 40. A material having a certain strength is preferably used for the substrate 40. Specific examples of the material used for the substrate 40 include ceramics such as alumina, aluminum nitride, and mullite and resins such as phenolic resins, epoxy resins, polyimide resins, bismaleimide-triazine resins (BT resins), and polyphthalamides (PPAs). The supporting member can define a recess. This structure facilitates formation of the above light-reflective member 20 by dropping and hardening the material.

The conductor wirings and a heat radiation terminal can be made of, for example, a metal such as Cu, Ag, Au, Al, Pt, Ti, W, Pd, Fe, and Ni or an alloy of these metals. The conductor wirings can be formed using electroplating, electroless plating, vacuum evaporation, sputtering, or the like.

The light-emitting device 100 having a structure described above allows light emitted from the light-emitting element 30 to be irradiated to a more distant location in the case in which, for example, the light-emitting device 100 is used for a headlight of a motorcycle or automobile, or the lighting for a ship or aircraft. That is, in the light-emitting device 100, a portion of light emitted from one or more light-emitting elements 30 travels directly to the upper surface 3 of the second light-transmissive member through the light-transmissive member unit 10 without being reflected by the light-reflective member 20, and another portion of light emitted from one or more light-emitting elements 30 is reflected by the light-reflective member 20 and then emitted from the upper surface 3 of the second light-transmissive member. With the area of the lower surface 7 of the first light-transmissive member larger than the sum of the areas of the upper surfaces of the light-emitting elements 30 in the light-emitting device 100, light emitted from the light-emitting elements 30 can be received with reduction in loss of light. Further, the area of the upper surface 3 of the second light-transmissive member is smaller than the sum of the areas of the upper surfaces 31 of the light-emitting elements 30, and is also smaller than the area of the lower surface 7 of the first light-transmissive member. This structure allows light emitted from the light-emitting elements 30 to be concentrated onto the upper surface 3 of the second light-transmissive member. The light-transmissive member unit 10 includes the second fillet 16B on the lateral surfaces 6 of the first light-transmissive member and the first fillet 16A on the lateral surfaces 32 of the light-emitting element 30, so that light can be efficiently transmitted to the upper surface 3, which is the light-extracting surface, of the second light-transmissive member. With this structure, the light-emitting device 100 can irradiate light to a more distant location with a high luminance and can be suitably used for a high-beam headlight. In FIG. 4, typical directions of radiation of light are schematically indicated by the arrows.

Method of Manufacturing Light-Emitting Device

A method S10 of manufacturing a light-emitting device shown in the flowchart in FIG. 5 will be described referring mainly to FIG. 6A to FIG. 6F.

The method S10 of manufacturing a light-emitting device includes providing the light-emitting element 30, the first light-transmissive member 1 containing the wavelength conversion member and having the lower surface having an area larger than an area of the upper surface of the light-emitting element, and the second light-transmissive member 2 including the lower surface having an area larger than an area of the upper surface of the first light-transmissive member 1 and including the upper surface having an area smaller than an area of the upper surface 31 of the light-emitting element 30 (step S11 of providing); bonding the first light-transmissive member 1 to the upper surface 31 of the light-emitting element 30 via the first light-guiding member 15A such that the first light-guiding member 15A is disposed over the lateral surfaces 32 of the light-emitting element 30 and the periphery of the lower surface of the first light-transmissive member 1 (step S13 of first bonding); and bonding the second light-transmissive member 2 to the upper surface 5 of the first light-transmissive member via the second light-guiding member 15B such that the second light-guiding member 15B is disposed over the lateral surfaces 6 of the first light-transmissive member and the periphery of the lower surface of the second light-transmissive member 2 (step S14 of second bonding).

An example in which the step S11 of providing, a step S12 of mounting the light-emitting element, the step S13 of first bonding, the step S14 of second bonding, a step S15 of disposing a light-reflective member, and a step S16 of singulating are performed in this order will be described below. These steps can be performed in any appropriate order, and order of the steps can be changed from the order of the steps in the description below. FIG. 6A to FIG. 6E show the manufacturing of one light-emitting device to simplify the description, and FIG. 6F shows the state where portions connecting a plurality of light-emitting devices have been cut.

Providing Light-Emitting Element, First Light-Transmissive Member, Second Light-Transmissive Member In the step S11 of providing, the light-emitting element 30, the first light-transmissive member 1, and the second light-transmissive member 2 are provided. In the step S11 of providing, a member that contains the wavelength conversion member 11 and has the lower surface 7 with an area larger than the upper surface 31 of the light-emitting element 30 is provided as the first light-transmissive member 1. In addition, in the step S11 of providing, the second light-transmissive member 2 that has the lower surface 8 having an area larger than an area of the upper surface 5 of the first light-transmissive member and the upper surface 3 having an area smaller than an area of the upper surface 31 of the light-emitting element 30 is provided. In the step S11 of providing, it is preferable that the first light-transmissive member 1 and the second light-transmissive member 2 have already been cut into sizes that enable bonding to the light-emitting element 30. The second light-transmissive member 2 has been worked to have a trapezoidal sectional shape.

Mounting Light-Emitting Element

In the step S12 of mounting the light-emitting element, the light-emitting element 30 provided is mounted on or above the substrate 40. The substrate 40 used in the step S12 of mounting the light-emitting element is formed into a substantially rectangular flat-plate shape in a plan view. In the substrate 40, for example, the supporting member is provided with the conductor traces and the heat radiation terminal. In the step S12 of mounting the light-emitting element, in each light-emitting device 100, one light-emitting element 30 is mounted on or above the conductor traces of the substrate 40 with bonding members such as bumps therebetween.

First Bonding

Figure 6A:
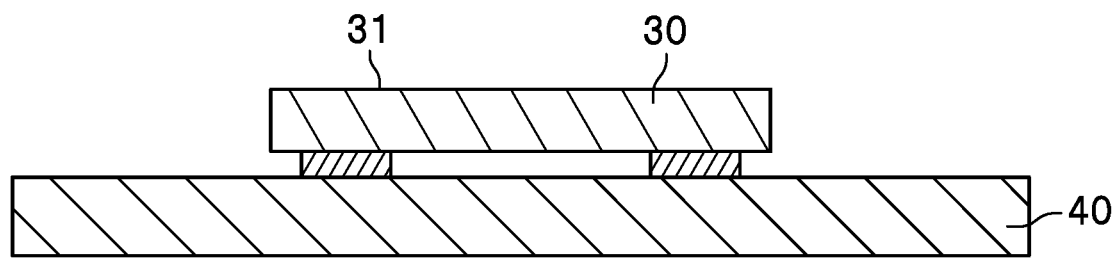
FIG. 6A is a schematic diagram illustrating a light-emitting element mounted on or above a substrate in the method of manufacturing the light-emitting device according to the first embodiment.
Figure 6B:
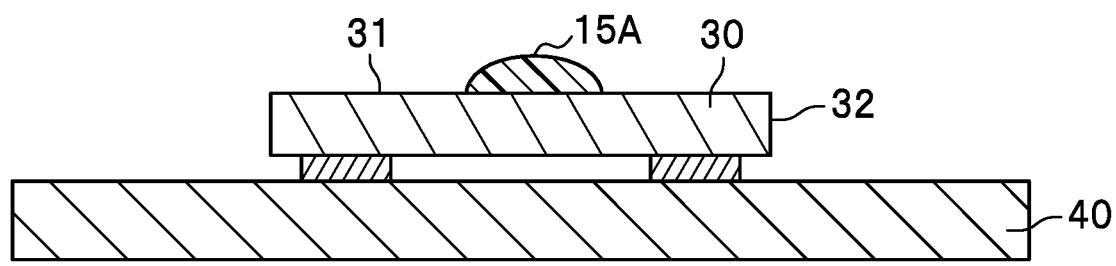
FIG. 6B is a schematic diagram illustrating a first light-guiding member dropped on the light-emitting element in the method of manufacturing the light-emitting device according to the first embodiment.
Figure 6C:
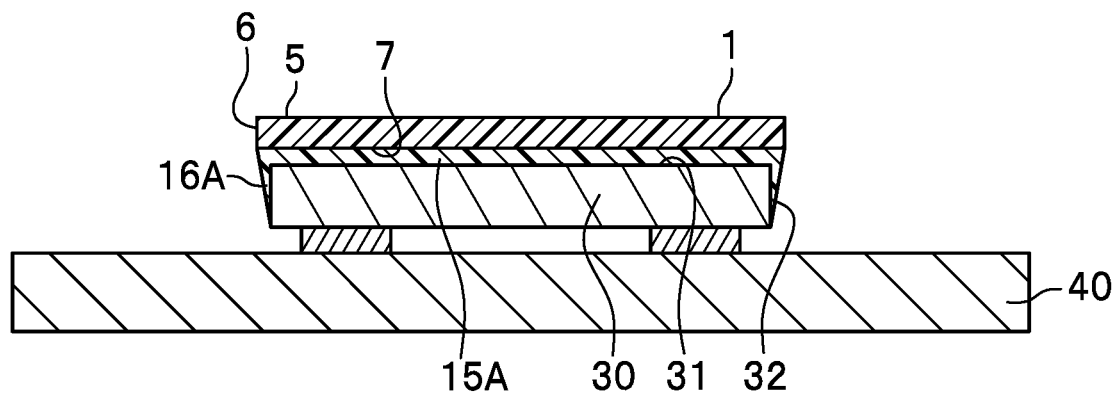
FIG. 6C is a schematic diagram illustrating a first light-transmissive member bonded to the light-emitting element with the first light-guiding member in the method of manufacturing the light-emitting device according to the first embodiment.

As shown in FIG. 6B and FIG. 6C, in the step S13 of first bonding, the first light-transmissive member 1 and the light-emitting element 30 are bonded together. In the step S13 of first bonding, the lower surface 7 of the first light-transmissive member and the upper surface 31 of the light-emitting element 30 are bonded together such that the periphery of the lower surface of the first light-transmissive member 1 is located outward of the periphery of the upper surface 31 of the light-emitting element 30.

The light-emitting element 30 and the first light-transmissive member 1 are bonded together via, for example, the first light-guiding member 15A serving as the adhesive material. To perform bonding with the first light-guiding member 15A, the first light-guiding member 15A is dropped on the upper surface 31 of the light-emitting element 30, and the first light-transmissive member 1 is disposed on the first light-guiding member 15A. The dropped first light-guiding member 15A is pressed by the first light-transmissive member 1 and wet-spreads to the lateral surfaces 32 of the light-emitting element 30. The first light-guiding member 15A forms the first fillet 16A between the lower surface 7 of the first light-transmissive member and the lateral surfaces 32 of the light-emitting element 30. The amount and viscosity of the first light-guiding member 15A to be dropped are appropriately adjusted such that the first fillet 16A is formed on the lateral surface 32 of the light-emitting element 30 and such that the first light-guiding member 15A does not spread to the substrate 40.

The first light-transmissive member 1 is preferably formed such that the area of the lower surface 7 is larger than the sum of the areas of the upper surfaces 31 of one or more light-emitting elements 30, and preferably arranged such that the distance between each of the lateral surfaces 32 of the one or more light-emitting elements 30 and a corresponding portion of the outer periphery of the lower surface 7 of the first light-transmissive member is constant on the outer periphery of the lower surface 7 of the first light-transmissive member. It is preferable that the center of the upper surface 5 of the first light-transmissive member substantially overlap the center of the entirety of the array of one or more light-emitting elements 30, which are arranged to form a rectangular shape as a whole in a plan view. The area of the lower surface 7 of the first light-transmissive member 1 bonded to the light-emitting elements 30 is larger than the sum of the areas of the upper surfaces 31 of the one or more light-emitting elements 30. With this structure, light emitted from the upper surfaces 31 of the one or more light-emitting elements 30 can be incident on the lower surface 7, which has an area larger than an area of the upper surfaces 31 of the light-emitting elements 30, of the first light-transmissive member 1 and from the first fillet 16A, so that light can be guided to the lower surface 8 of the second light-transmissive member with reduction in loss of light.

Second Bonding

Figure 6D:
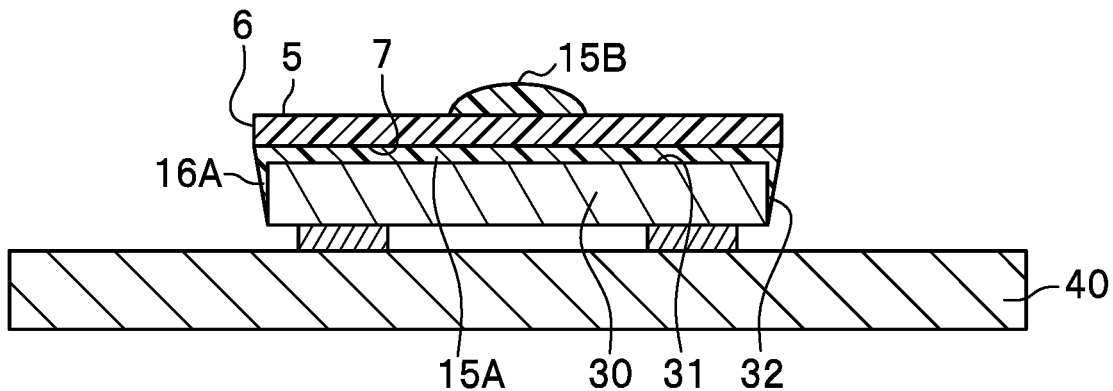
FIG. 6D is a schematic diagram illustrating a second light-guiding member dropped on the first light-transmissive member in the method of manufacturing the light-emitting device according to the first embodiment.
Figure 6E:
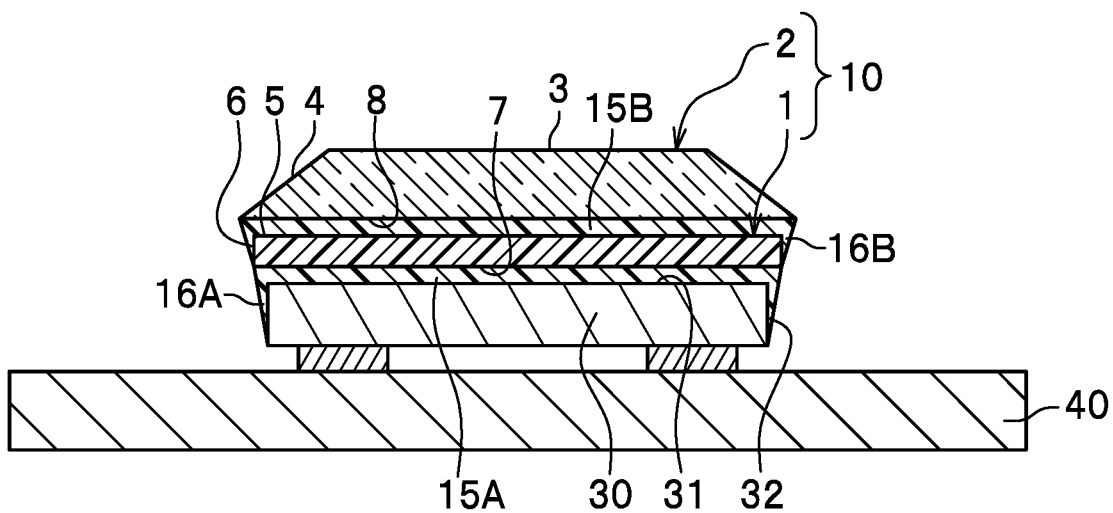
FIG. 6E is a schematic diagram illustrating the second light-transmissive member bonded to the first light-transmissive member with the second light-guiding member in the method of manufacturing the light-emitting device according to the first embodiment.
Figure 6F:
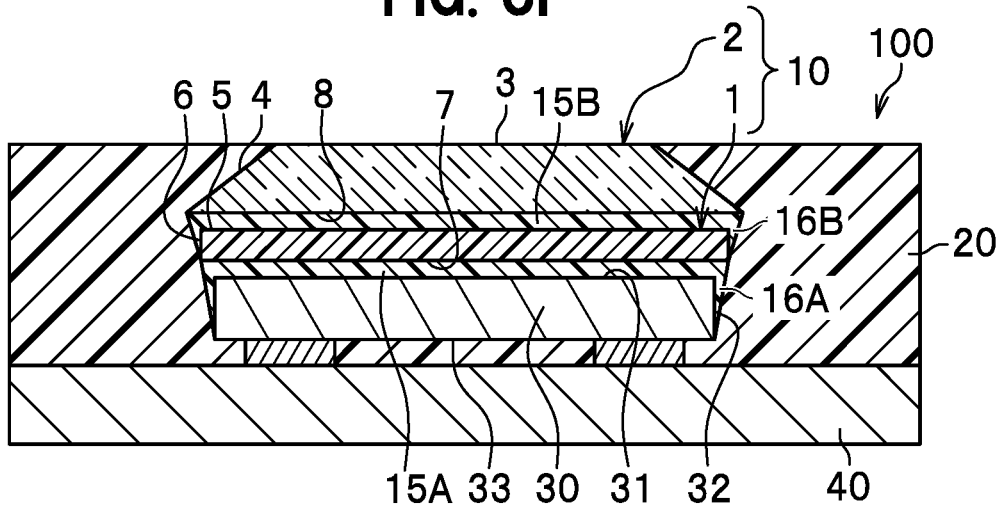
FIG. 6F is a schematic diagram illustrating a state where a light-reflective member is disposed around the light-emitting element and the light-transmissive members and where cutting into individual light-emitting devices has been performed in the method of manufacturing the light-emitting device according to the first embodiment.

As shown in FIG. 6D and FIG. 6E, in the step S14 of second bonding, the first light-transmissive member 1 and the second light-transmissive member 2 are bonded together. In the step S14 of second bonding, the lower surface 8 of the second light-transmissive member and the upper surface 5 of the first light-transmissive member are bonded together such that the periphery of the lower surface of the second light-transmissive member 2 is located outward of the periphery of the upper surface 5 of the first light-transmissive member.

In one example, the second light-transmissive member 2 and the first light-transmissive member 1 are bonded together via the second light-guiding member 15B serving as the adhesive material. To perform bonding via the second light-guiding member 15B, the second light-guiding member 15B is dropped on the upper surface 5 of the first light-transmissive member, and the second light-transmissive member 2 is disposed on the second light-guiding member 15B. The dropped second light-guiding member 15B is pressed by the second light-transmissive member 2, and accordingly wet-spreads to the lateral surfaces 6 of the first light-transmissive member. The second light-guiding member 15B forms the second fillet 16B between the lower surface 8 of the second light-transmissive member and the lateral surfaces 6 of the first light-transmissive member. The amount and viscosity of the second light-guiding member 15B to be dropped are appropriately adjusted such that the second fillet 16B is formed on the lateral surfaces 6 of the first light-transmissive member and such that the second light-guiding member 15B does not spread to the lateral surfaces 32 of the light-emitting element 30.

The second light-transmissive member 2 is preferably arranged such that the distance between the outer periphery of the lower surface 7 of the first light-transmissive member and the outer periphery of the lower surface 8 of the second light-transmissive member 2 is constant on the outer periphery of the lower surface 8 of the second light-transmissive member 2. It is preferable that the center of the upper surface 3 of the second light-transmissive member substantially overlap the center of the whole array of one or more light-emitting elements 30, which are arranged to form a rectangular shape as a whole in a plan view. The area of the lower surface 8 of the second light-transmissive member 2 bonded to the first light-transmissive member 1 is larger than the area of the upper surface 5 of the first light-transmissive member and is also larger than the area of the upper surfaces 31 of the light-emitting elements 30.

With this structure, in the light-transmissive member unit 10, light emitted from the upper surfaces 31 of the light-emitting elements 30 and incident on the lower surface 7 of the first light-transmissive member and from the first fillet 16A is incident on the lower surface 8 of the second light-transmissive member and the second fillet 16B, so that light can be guided to the upper surface 3 of the second light-transmissive member having an area smaller than an area of the upper surfaces 31 of the light-emitting elements 30 with reduction in loss of light.

Forming Light-Reflective Member

Subsequently, in the step S15 of disposing a light-reflective member, the light-reflective member 20 is disposed around the light-emitting elements 30 and the light-transmissive member unit 10 disposed above the substrate 40. In the step S15 of disposing a light-reflective member, the light-reflective member 20 is disposed to cover the light-emitting elements 30, the light-transmissive member unit 10, and the substrate 40 as shown in FIG. 6F.

In the step S15 of disposing a light-reflective member, the light-reflective member 20 is supplied to cover the upper surface of the substrate 40, the lateral surfaces of the first light-guiding member 15A, the lateral surfaces of the second light-guiding member 15B, and the lateral surfaces 4 of the second light-transmissive member. The light-reflective member 20 is supplied such that the light-reflective member 20 covers the lateral surface 4 of the second light-transmissive member but does not cover the upper surface 3 of the second light-transmissive member. The light-reflective member 20 is preferably dropped onto the upper surface of the substrate 40 apart from the light-transmissive member unit 10 such that the upper surface 3 of the second light-transmissive member is exposed from the light-reflective member 20.

For example, a resin containing titanium oxide mixed in a silicone resin is used as the light-reflective member 20 in the present embodiment. The light-emitting device 100 can include a layered structure of one or more types of the light-reflective member 20.

In the step S15 of disposing a light-reflective member, the light-reflective member 20 that has been supplied is cured by naturally drying or performing heating, so that the light-reflective member 20 is formed surrounding the light-emitting elements 30 and the light-transmissive member unit 10.

Singulating

In the step S16 of singulating, singulation into individual light-emitting devices 100 is performed. In the step S16 of singulating, after the formation of the light-reflective member 20, the substrate 40 is cut corresponding to individual light-emitting devices using laser irradiation or using a tool such as a blade, as indicated by imaginary lines in FIG. 6F to provide the light-emitting devices 100.

As shown in FIG. 4, in each light-emitting device 100 manufactured through the steps described above, light emitted from one or more light-emitting elements 30 can be incident on the lower surface 7 of the first light-transmissive member having an area larger than the sum of the areas of the upper surfaces 31 of the one or more light-emitting elements 30, and can be emitted to the outside from the upper surface 3 of the second light-transmissive member smaller than the lower surface 7 of the first light-transmissive member, such that light with a high luminance is emitted to the outside. The first fillet 16A made of the first light-guiding member 15A and the second fillet 16B made of the second light-guiding member 15B allow light emitted from the light-emitting elements 30 to be extracted from the upper surface 3 of the second light-transmissive member with reduction in loss of light. In the case in which the light-transmissive member unit 10 is made of a glass material, the irradiation surface of the light-emitting device 100 does not easily deteriorate, and light-emitting device 100 can have good product quality.

Figure 8A:
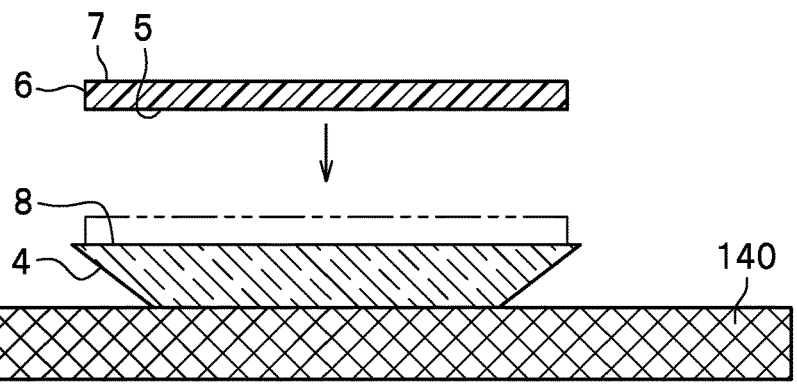
FIG. 8A is a schematic diagram illustrating a state in which the second light-transmissive member and the first light-transmissive member are to be directly bonded together in another method of manufacturing the light-emitting device according to the first embodiment.
Figure 8B:
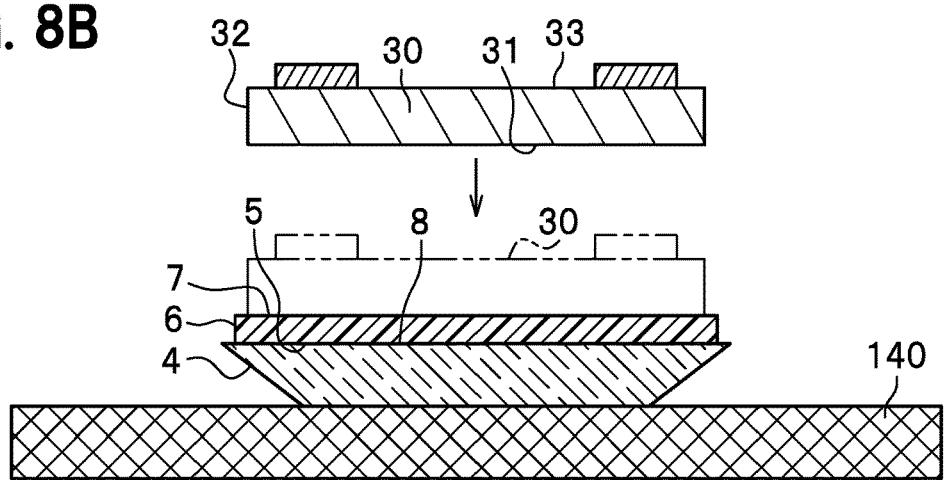
FIG. 8B is a schematic diagram illustrating a state in which the first light-transmissive member and the light-emitting element are to be directly bonded together in the another method of manufacturing the light-emitting device according to the first embodiment.
Figure 8C:
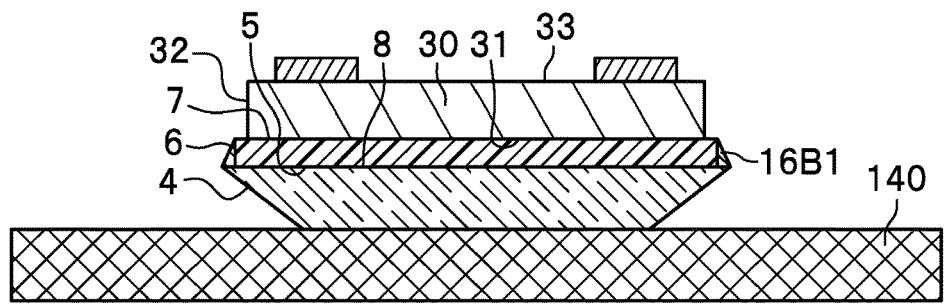
FIG. 8C is a schematic diagram illustrating a state in which a second fillet is formed using the second light-guiding member in another method of manufacturing the light-emitting device according to the first embodiment.
Figure 8D:
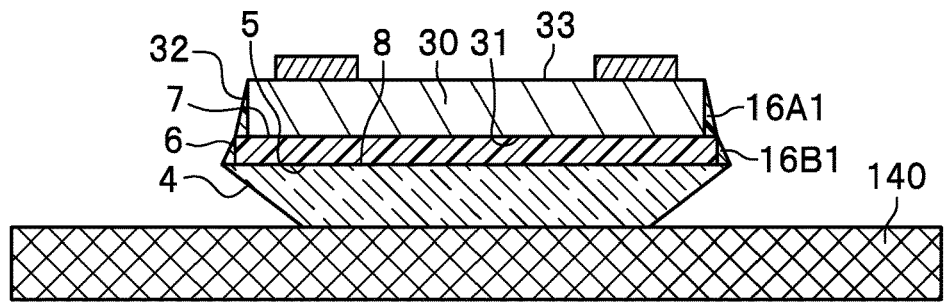
FIG. 8D is a schematic diagram illustrating a state in which a first fillet is formed using the first light-guiding member in the another method of manufacturing the light-emitting device according to the first embodiment.
Figure 8E:
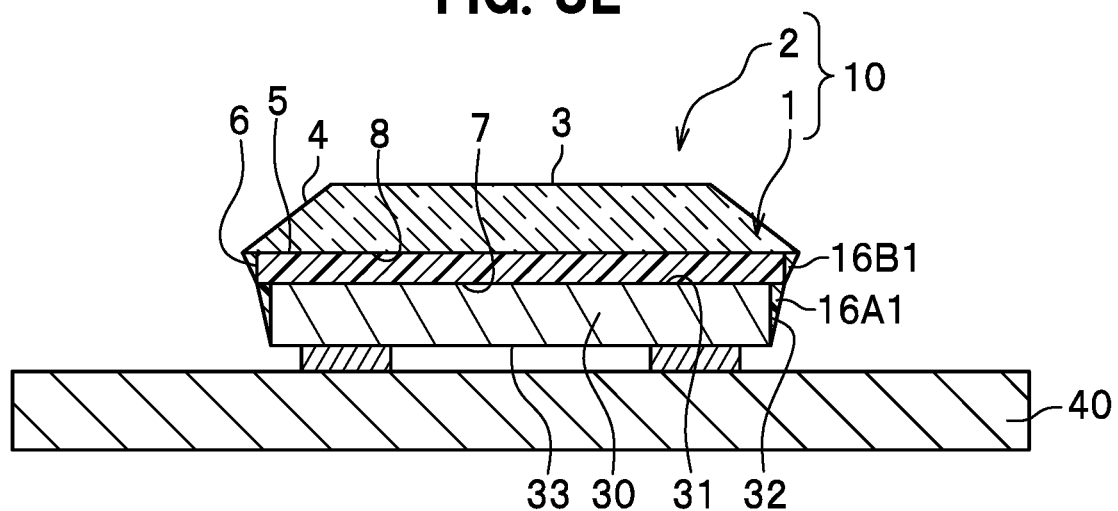
FIG. 8E is a schematic diagram illustrating the light-emitting element mounted on or above the substrate with the second light-transmissive member being removed from a supporting plate in the another method of manufacturing the light-emitting device according to the first embodiment.
Figure 8F:
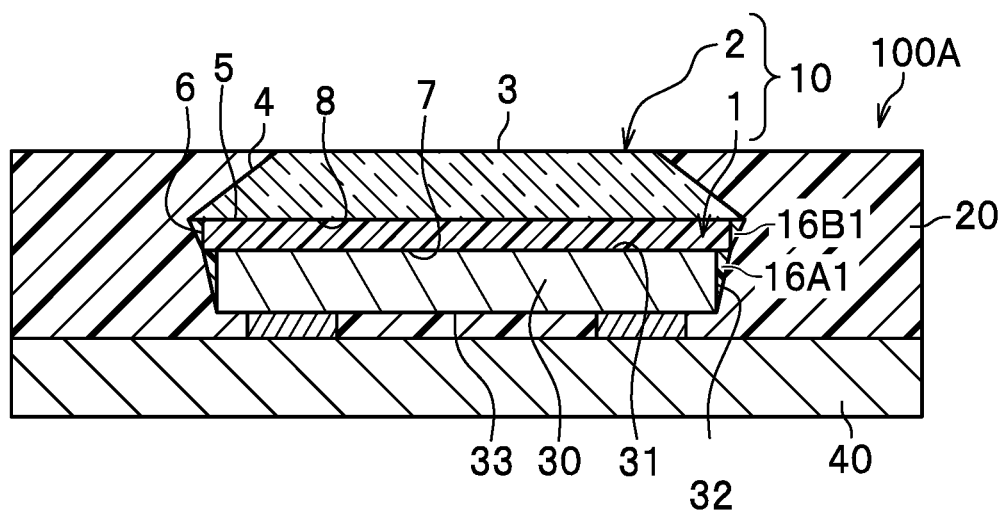
FIG. 8F is a schematic diagram illustrating a state where the light-reflective member is disposed around the light-emitting element and the light-transmissive members and where cutting into individual light-emitting devices has been performed in the another method of manufacturing the light-emitting device according to the first embodiment.

In the method of manufacturing a light-emitting device, the first light-transmissive member 1 can be directly bonded to the second light-transmissive member 2 and the light-emitting elements 30, and a first fillet 16A1 and a second fillet 16B1 similar to the first fillet 16A and the second fillet 16B can be formed (see FIG. 8F).

That is, the method includes providing the light-emitting element 30, the first light-transmissive member 1 containing the wavelength conversion member and including the lower surface having an area larger than an area of the upper surface 31 of the light-emitting element 30, and the second light-transmissive member 2 including the lower surface 8 having an area larger than an area of the upper surface 5 of the first light-transmissive member and including the upper surface 3 having an area smaller than an area of the upper surface 31 of the light-emitting element 30 (step S21 of providing); directly bonding the upper surface 5 of the first light-transmissive member to the lower surface 8 of the second light-transmissive member (step S23 of first direct-bonding); directly bonding the lower surface 7 of the first light-transmissive member 1 in the light-transmissive member unit 10 to the upper surface 31 of the light-emitting element 30 such that the periphery of the lower surface of the first light-transmissive member 1 is located outward of the periphery of the upper surface of the light-emitting element 30 (step S24 of second direct-bonding); disposing the second light-guiding member 15B over the lateral surfaces 6 of the first light-transmissive member and the periphery of the lower surface of the second light-transmissive member (S241); and disposing the first light-guiding member 15A over the lateral surfaces 32 of the light-emitting element and the periphery of the lower surface of the first light-transmissive member (S241).

Figure 7:
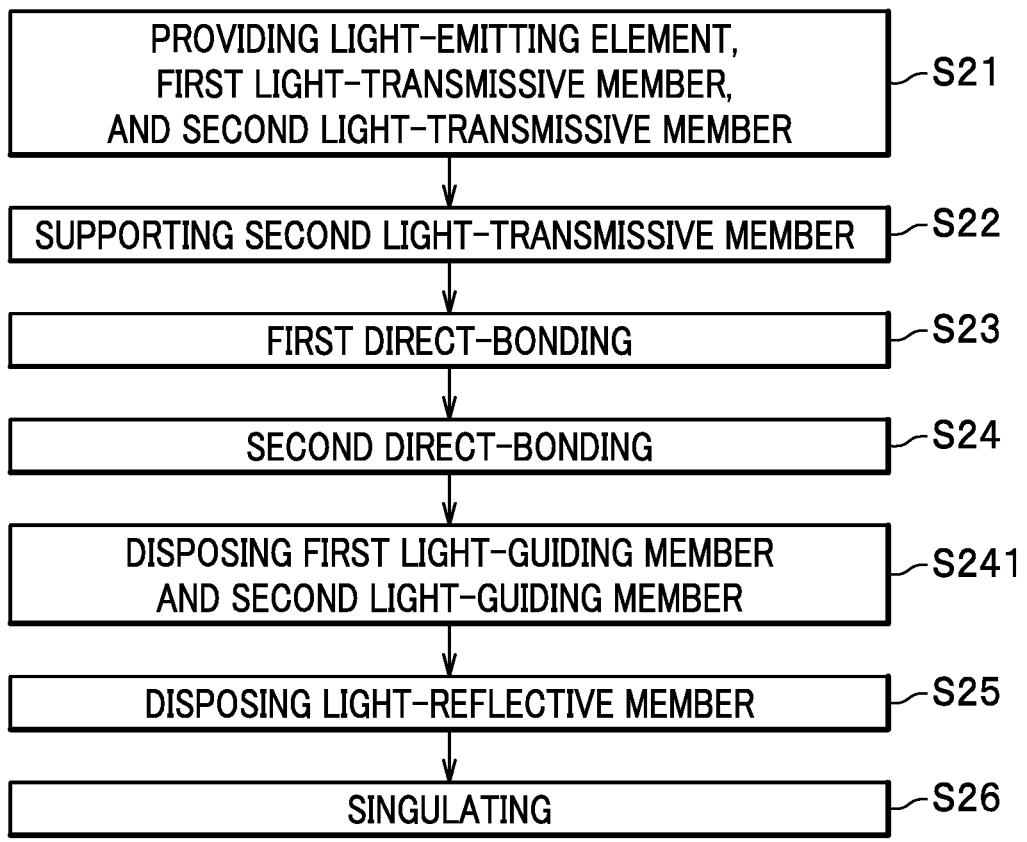
FIG. 7 is a flowchart illustrating another method of manufacturing the light-emitting device according to the first embodiment.

An example of the method of manufacturing a light-emitting device in which the step S21 of providing, a step S22 of supporting the second light-transmissive member, the step S23 of first direct-bonding, the step S24 of second direct-bonding, step S241 of disposing the first light-guiding member and the second light-guiding member, a step S25 of disposing a light-reflective member, and a step S26 of singulating are performed in this order as shown in FIG. 7 will be described below. These steps can be performed in any appropriate order, and the order of the steps can be changed from the order in the description below. FIG. 8A to FIG. 8E show the manufacture of a single light-emitting device to simplify the description, and FIG. 8F shows the state where portions connecting a plurality of light-emitting devices have been cut. The step S21 of providing, the step S25 of disposing a light-reflective member, and the step S26 of singulating are the same as the steps S11, S15, and S16 described above, and repetitive descriptions thereof will be omitted as appropriate.

As shown in FIG. 8A, the second light-transmissive member 2 provided in the step S21 of providing is supported by a supporting plate 140 in the step S22 of supporting the second light-transmissive member. In the step S22 of supporting the second light-transmissive member, the upper surface 3 of the second light-transmissive member is temporarily fixed to the supporting plate 140, so that the second light-transmissive member is supported. In the step S22 of supporting the second light-transmissive member, for example, the second light-transmissive member 2 is supported on the supporting plate 140 via an adhesive material such as a UV-curable resin used for temporary fixing. The second light-transmissive member 2 is supported on the supporting plate 140 such that the lower surface 8 of the second light-transmissive member 2 facing upward of the supporting plate 140.

In the step S23 of first direct-bonding, the upper surface 5 of the first light-transmissive member is directly bonded to the lower surface 8 of the second light-transmissive member. In the case in which the first light-transmissive member 1 and the second light-transmissive member 2 are made of an inorganic material, the members can be directly bonded together by, for example, press-bonding, sintering, surface-activated bonding, atomic diffusion bonding, or hydroxy-group bonding in the step S23 of first direct-bonding. Direct bonding between the first light-transmissive member 1 and the second light-transmissive member 2 that are made of the same material allows for reducing reflection caused due to difference in the refractive indices, which allows for improving the light extraction efficiency.

In the step S24 of second direct-bonding, the upper surface 31 of the light-emitting element 30 is directly bonded to the lower surface 7 of the first light-transmissive member. In the step S24 of second direct-bonding, direct bonding can be performed in substantially in the same manner as in the step S23. A sapphire substrate, which is made of an inorganic material similarly to the first light-transmissive member 1, of the light-emitting element 30 is bonded to the lower surface 7 of the first light-transmissive member.

In step S241 of disposing the first light-guiding member and the second light-guiding member, the second light-guiding member 15B is disposed over the lateral surfaces 6 of the first light-transmissive member and the periphery of the lower surface of the second light-transmissive member, and the first light-guiding member 15A is formed over the periphery of the lower surface of the first light-transmissive member and the lateral surfaces 32 of the light-emitting element 30. In the step S241, the first fillet 16A1 is formed using the first light-guiding member 15A, and the second fillet 16B1 is formed using the second light-guiding member 15B. A first light-guiding member 15A and a second light-guiding member 15B used in this step can be made of the same material or different materials. Each of the first fillet 16A1 and the second fillet 16B 1 has a substantially triangular cross-sectional shape and guide a portion of light emitted from the light-emitting element 30 to the upper surface 3 of the second light-transmissive member. The first fillet 16A1 is formed by disposing the first light-guiding member 15A over the periphery of the lower surface of the first light-transmissive member and the lateral surfaces 32 of the light-emitting element 30 using a dispenser or the like. The second fillet 16B1 is formed by disposing the second light-guiding member 15B over the lateral surfaces 6 of the first light-transmissive member and the periphery of the lower surface of the second light-transmissive member using a dispenser or the like.

It is preferable that the first fillet 16A1 is formed using the first light-guiding member 15A and then the second fillet 16B 1 is formed using the second light-guiding member 15B. It is more preferable that the second fillet 16B1 be disposed and cured before the first fillet is disposed and cured. After the first fillet 16A1 and the second fillet 16B1 are formed, the second light-transmissive member 2 is removed from the supporting plate 140, and the light-emitting element 30 is flip-chip bonded to the substrate 40, as shown in FIG. 8D and FIG. 8E. After the light-emitting element 30 is mounted on or above the substrate 40, the step S25 of disposing a light-reflective member and the step S26 of singulating described above are performed to obtain a light-emitting device 100A. In the obtained light-emitting device 100A, the first light-transmissive member 1 is directly bonded to the second light-transmissive member 2 and the light-emitting element 30, so that reflection caused due to difference in the refractive indices can be reduced to increase the light extraction efficiency. In the light-emitting device 100A, the first fillet 16A1 made of the first light-guiding member 15A and the second fillet 16B1 made of the second light-guiding member 15B further increase the light extraction efficiency.

Modified Examples

Figure 9A:
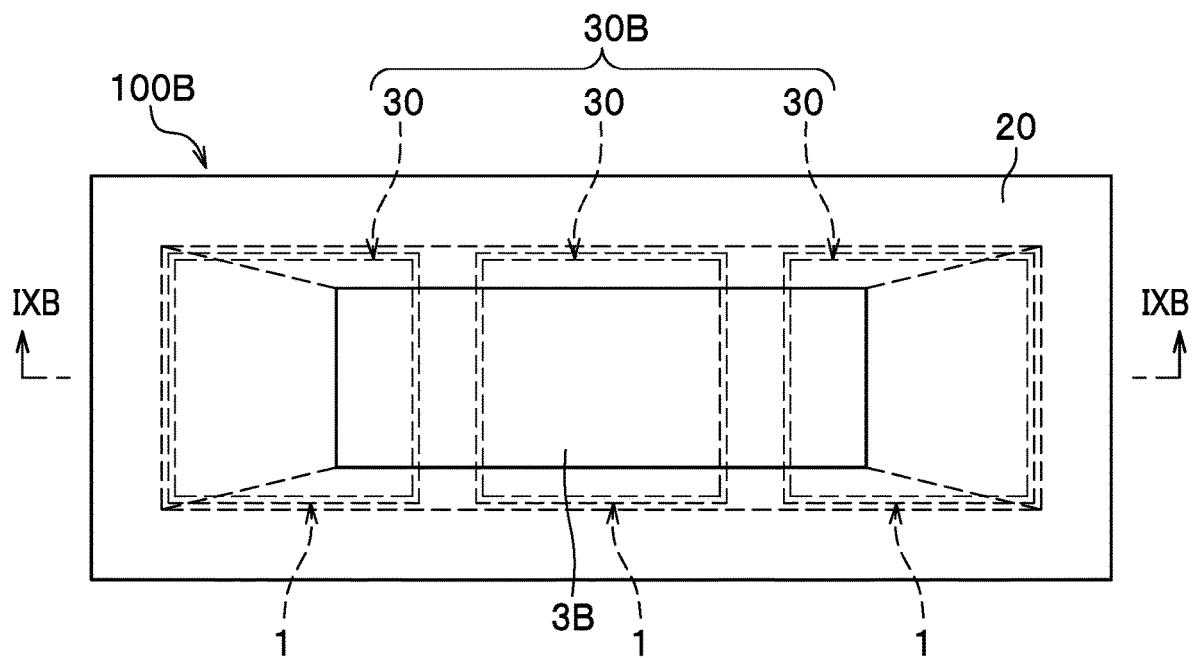
FIG. 9A is a schematic plan view of a light-emitting device according to a modification of the first embodiment.
Figure 9B:
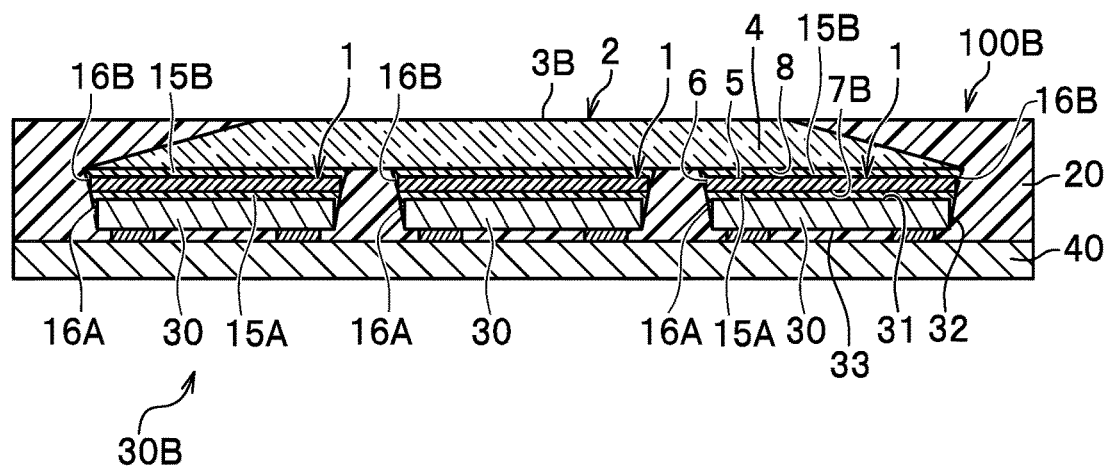
FIG. 9B is a schematic sectional view taken along the line IXB-IXB of FIG. 9A.

A light-emitting element array 30B including a plurality of light-emitting elements 30 can be included in a light-emitting device 100B as shown in FIG. 9A and FIG. 9B. Components in the light-emitting device 100B will be described below. Components that are the same as those in the light-emitting device 100 and the method of manufacturing the light-emitting device 100 that has been described above will be indicated by the same reference numeral, and repetitive descriptions thereof will be omitted as appropriate.

The light-emitting device 100B can include the light-emitting element array 30B including a plurality of light-emitting elements 30. For example, the light-emitting element array 30B includes three light-emitting elements 30 of the same size aligned in a straight line to be adjacent to each other. In the case in which the light-emitting elements 30 are arranged adjacent to each other, the light-transmissive member unit 10 has a structure in which an area of a region surrounded by the outermost periphery of the lower surfaces 7 of a plurality of the first light-transmissive members is larger than an area of a region of the light-emitting element array 30B, which is the total area of the plurality of light-emitting elements 30 arranged in a row. The expression "a region of the light-emitting element array 30B" as used herein refers to the rectangular region surrounded by straight lines forming the outermost periphery of the three light-emitting elements 30, and the area of the upper surface of the light-emitting element array 30B includes the regions between the light-emitting elements 30. The light-transmissive member unit 10 is formed such that the area of an upper surface 3B of the second light-transmissive member is smaller than the area of the light-emitting element array 30B. In the light-emitting device 100B having such a structure, light emitted from a plurality of light-emitting elements 30 can be incident on lower surfaces 7B of the first light-transmissive members and can be emitted to the outside from the upper surface 3B, having an area smaller than the total area of the lower surfaces 7B of the first light-transmissive members, of the second light-transmissive member, so that light can be irradiated to a distant location with a higher luminance.

In the case in which a plurality of light-emitting elements 30 are disposed, the first fillets 16A and the second fillets 16B can be formed by disposing each of the first light-guiding members 15A between a respective one of the light-emitting elements 30 and a respective one of the first light-transmissive members 1 and disposing each of the second light-guiding members 15B between a respective one of the first light-transmissive members 1 and the second light-transmissive member 2. Alternatively, each of the first light-transmissive members 1 can be directly bonded to a respective one of the light-emitting elements 30 and the second light-transmissive member 2, and formation of the first fillets 16A and the second fillets 16B can be performed separately from the bonding of each the first light-transmissive member 1 to a respective light-emitting element 30 and the second light-transmissive member 2. The first fillets 16A and the second fillets 16B allows for reducing unevenness in emission color and unevenness in luminance of the light-emitting elements 30.

Figure 11A:
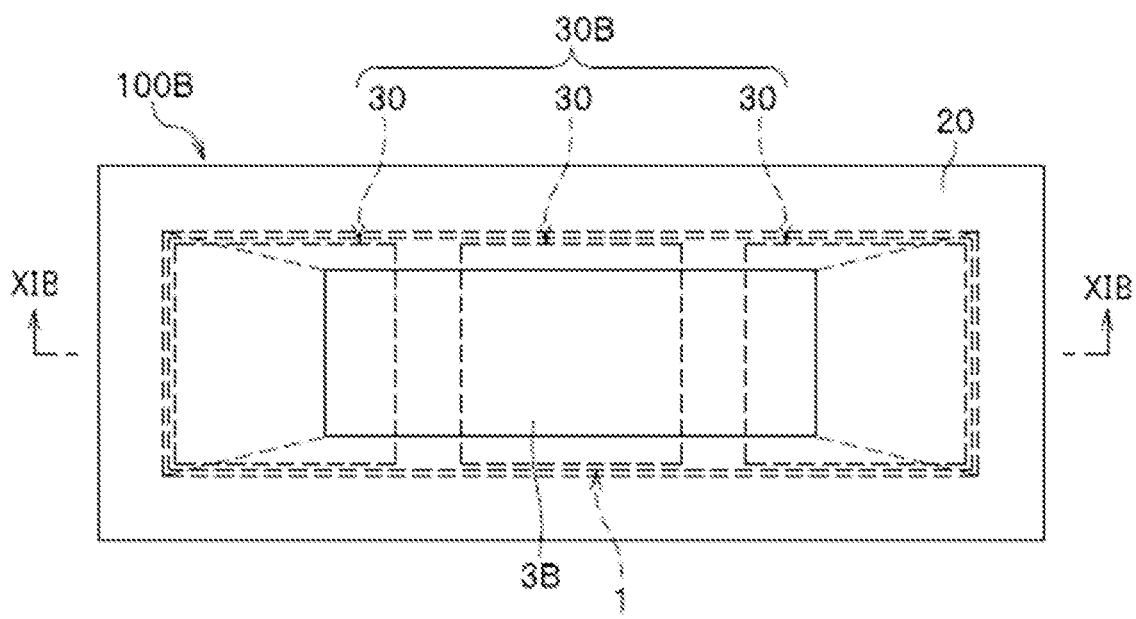
FIG. 11A is a schematic plan view of a light-emitting device according to a further modification of the first embodiment.
Figure 11B:
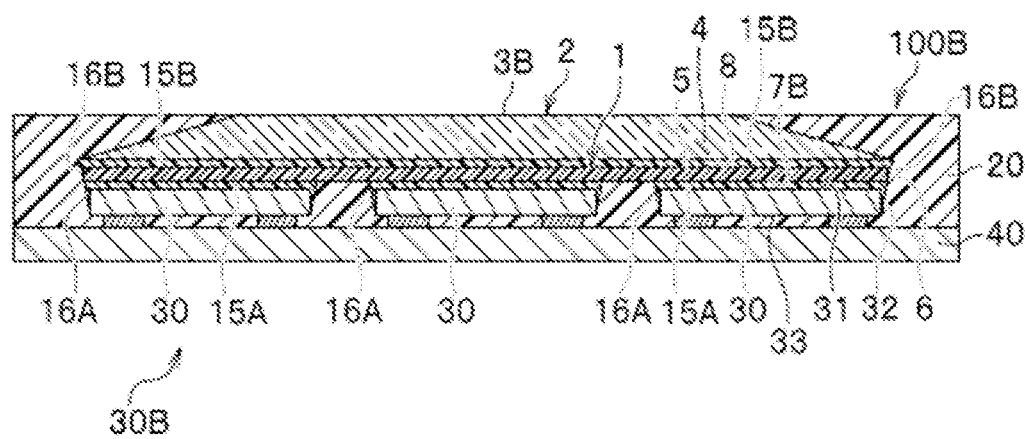
FIG. 11B is a schematic sectional view taken along the line XIB-XIB of FIG. 1A.

While the light-emitting device 100B in the description above has a structure in which each of the first light-transmissive members 1 is disposed on or above a respective one of light-emitting elements 30, the first light-transmissive member 1 can have a size large enough to cover all of a plurality of light-emitting elements 30, for example, as shown in FIGS. 11A and 11B. In other words, the upper surfaces 31 of the light-emitting elements 30 can be bonded to the lower surface 7 of the first light-transmissive member. A single first light-transmissive member 1 is disposed on a single second light-transmissive member 2 in FIG. 8B, but a single first light-transmissive member can be disposed on or above a plurality of second light-transmissive members 2 and can be directly bonded or bonded using the first light-guiding member 15A to a plurality of light-emitting elements 30. The number of the light-emitting elements 30 is three in the description above, but the number can be two, four, five, six, or seven or more.

In the case in which a plurality of light-emitting elements 30 are included, the light-emitting element array (that is, a plurality of light-emitting elements 30) preferably forms a substantially rectangular shape as a whole in a plan view.

Also, while the second light-transmissive member 2 has a substantially truncated pyramidal shape in the description above, the second light-transmissive member 2 can have a shape such as a truncated cone, a truncated elliptical cone, or a truncated pyramid with rounded corners as long as the lateral surface(s) 4 is inclined.

The corners of the second light-transmissive member 2 can be rounded in a plan view. The shape of the rounded corner of the second light-transmissive member 2 in a plan view can form a curved line, or the corner can be formed by polygonal lines of one or more straight lines. In the manufacturing method of the present disclosure, the second light-transmissive member 2 that has been processed and the first light-transmissive member 1 can be bonded together before being bonded to the light-emitting element 30.

In addition, in the case in which a plurality of light-emitting elements 30 are bonded to one light-transmissive member unit 10, effects of arrangement of the light-emitting elements 30 and effects of light distribution, luminance unevenness, and color unevenness caused by arrangement of the light-emitting elements 30 are reduced. In addition, the first light-guiding member 15A that bonds the light-transmissive member unit 10 to the light-emitting element 30 and the second light-guiding member 15B can contain a wavelength conversion member, a light-diffusing material, etc. In addition, in the case in which a plurality of light-emitting elements 30 are mounted, each light-transmissive member unit 10 can be bonded to a respective one of the light-emitting elements 30.

In the light-emitting device 100, 100A, or 100B, a protective element such as a Zener diode can be mounted on the substrate 40. The protective element can be embedded in the light-reflective member 20, which allows for preventing reduction in light extraction due to absorption and shading of light from the light-emitting elements 30 by the protective element.

Further, when using two light-emitting elements 30, the two light-emitting elements 30 are preferably arranged at an interval that allows the first fillet 16A or 16A1 and the second fillet 16B or 16B 1 to be continuously disposed between the two light-emitting elements 30. More specifically, in the case in which the light-emitting device 100, 100A, or 100B includes two or more light-emitting elements 30, the distance between adjacent light-emitting elements 30 is preferably twice or less of the thickness of the light-emitting elements 30.

Either one of the first fillet 16A1 and the second fillet 16B1 can be formed and cured before the other one of the first fillet 16A1 and the second fillet 16B1 is formed and cured.

Each of the first fillet 16A or 16A1 and the second fillet 16B or 16B1 is preferably disposed over the entirety of the lateral surfaces 32 of the light-emitting element 30 from the upper end to the lower end or the entirety of the lateral surfaces 6 of the first light-transmissive member from the upper end to the lower end, but the first fillet 16A or 16A1 and the second fillet 16B or 16B1 can cover half or more of each lateral surface 32 or each lateral surface 6 in the vertical direction.

Figure 10A:
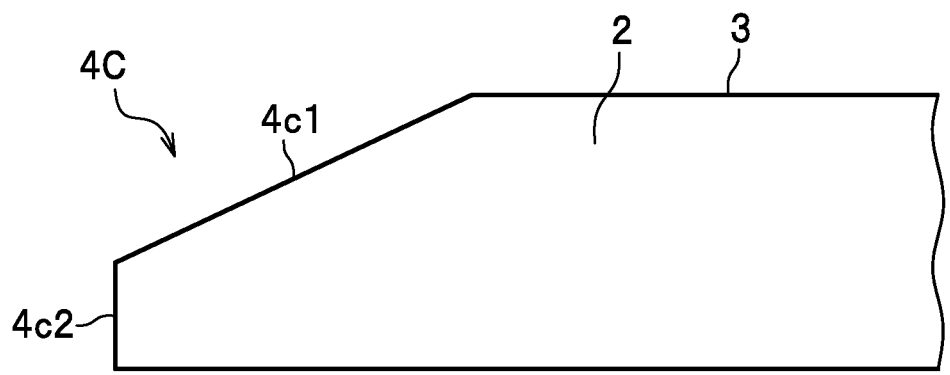
FIG. 10A is a schematic diagram illustrating a second light-transmissive member of a modification of the light-emitting device of the first embodiment.
Figure 10B:
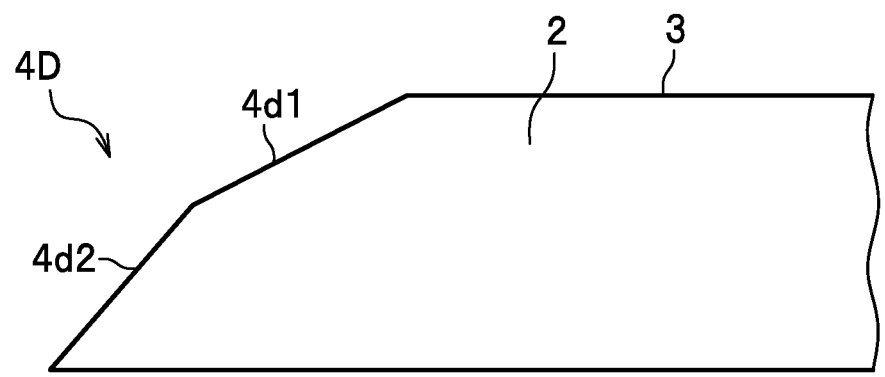
FIG. 10B is a schematic diagram illustrating a second light-transmissive member of another modification of the light-emitting device of the first embodiment.

As shown in FIG. 10A, the second light-transmissive member 2 can include lateral surfaces 4C constituted of a perpendicular lateral surface 4c2 at the first light-transmissive member side 1 and an inclined surface 4c1 adjacent to the perpendicular lateral surface 4c2 so that the inclination angle of the lateral surface 4 to be in a predetermined range. Alternatively, the second light-transmissive member 2 can have a lateral surface 4D constituted of a first inclined surface 4d1 and a second inclined surface 4d2 as shown in FIG. 10B. The inclination angles of the first inclined surface 4d1 and the second inclined surface 4d2 are different from each other.

Also, in the method of manufacturing the light-emitting device according to certain embodiments, breakage of components during the manufacturing operation and leakage of light from a portion surrounding the light-extracting surface are greatly reduced.

The light-emitting device can be used for a light source for a headlight of a vehicle such as motorcycles and automobiles or a conveyance such as ships and aircraft. Other applications of the light-emitting device include various light sources such as light sources for various types of lighting including spotlights, light sources for display devices, and vehicle components.

What is claimed is:

1. A light-emitting device comprising:
   at least one light-emitting element having an upper surface and at least one lateral surface;
   a first light-transmissive member bonded to the upper surface of the light-emitting element, the first light-transmissive member containing a wavelength conversion member and including:
      an upper surface,
      at least one lateral surface, and
      a lower surface having an area larger than an area of the upper surface of the light-emitting element and having a periphery located outward of the upper surface of the light-emitting element;
   a second light-transmissive member bonded to the upper surface of the first light-transmissive member and including:
      a lower surface having an area larger than an area of the upper surface of the first light-transmissive member and having a periphery located outward of the upper surface of the first light-transmissive member, and
      an upper surface having an area smaller than an area of the upper surface of the light-emitting element;
   a first light-guiding member disposed over the at least one lateral surface of the light-emitting element and the periphery of the lower surface of the first light-transmissive member;
   a second light-guiding member disposed over the at least one lateral surface of the first light-transmissive member and the periphery of the lower surface of the second light-transmissive member, and
   a light-reflective member covering the at least one lateral surface of the first light-guiding member, at least one lateral surface of the second light-guiding member, and at least one lateral surface of the second light-transmissive member.

2. The light-emitting device according to claim 1, wherein the light-emitting element is flip-chip bonded to a substrate.

3. The light-emitting device according to claim 1, wherein the second light-transmissive member includes at least one lateral surface between the upper surface and the lower surface of the second light-transmissive member, and the at least one lateral surface of the second light-transmissive member is inclined toward the upper surface of the second light-transmissive member.

4. The light-emitting device according to claim 1,
   wherein the second light-transmissive member includes at least one lateral surface between the upper surface and the lower surface of the second light-transmissive member, and each of the at least one lateral surface of the second light-transmissive member comprises:
      a perpendicular lateral surface perpendicular to the upper surface of the second light-transmissive member or the lower surface of the second light-transmissive member; and
      an inclined surface connected to the perpendicular lateral surface, and
   wherein the inclined surface is inclined toward the upper surface of the second light-transmissive member.

5. The light-emitting device according to claim 1,
wherein the second light-transmissive member includes at least one lateral surface between the upper surface and the lower surface of the second light-transmissive member, and each of the at least one lateral surface comprises a first inclined surface and a second inclined surface at different angles, and
wherein each of the first inclined surface and the second inclined surface is inclined toward the upper surface of the second light-transmissive member.

6. The light-emitting device according to claim 1, wherein the first light-transmissive member and the second light-transmissive member are made of borosilicate glass, sapphire glass, or quartz glass.

7. The light-emitting device according to claim 1, wherein the first light-transmissive member and the second light-transmissive member are directly bonded together.

8. The light-emitting device according to claim 1, wherein the at least one lateral surface of the second light-transmissive member is covered with a reflective film.

9. The light-emitting device according to claim 2, wherein the light-reflective member covers an upper surface of the substrate.

10. The light-emitting device according to claim 1,
wherein the light-emitting device comprises a plurality of light-emitting elements,
wherein the lower surface of the first light-transmissive member is bonded to upper surfaces of the plurality of light-emitting elements, and
wherein the area of the upper surface of the second light-transmissive member is smaller than a total area of the upper surfaces of the plurality of light-emitting elements.

11. A method of manufacturing a light-emitting device, the method comprising:
providing:
at least one light-emitting element including an upper surface and at least one lateral surface,
at least one first light-transmissive member containing a wavelength conversion member and including an upper surface, at least one lateral surface, and a lower surface that has an area larger than an area of the upper surface of the light-emitting element, and
a second light-transmissive member including a lower surface that has an area larger than an area of the upper surface of the first light-transmissive member and including an upper surface having an area smaller than an area of the upper surface of the light-emitting element;
bonding the first light-transmissive member to the upper surface of the light-emitting element via a first light-guiding member such that the first light-guiding member is disposed over the at least one lateral surface of the light-emitting element and a periphery of the lower surface of the first light-transmissive member;
bonding the second light-transmissive member to the upper surface of the first light-transmissive member via a second light-guiding member such that the second light-guiding member is disposed over the at least one lateral surface of the first light-transmissive member and a periphery of the lower surface of the second light-transmissive member; and
disposing a light-reflective member to cover the at least one lateral surface of the second light-transmissive member, at least one lateral surface of the second light-guiding member, and at least one lateral surface of the first light-guiding member after disposing the first light-guiding member and the second light-guiding member.

12. The method of manufacturing a light-emitting device according to claim 11, wherein the first light-transmissive member and the second light-transmissive member comprise borosilicate glass, sapphire glass, or quartz glass.

13. The method of manufacturing a light-emitting device according to claim 11,
wherein the at least one first light-transmissive member is bonded to upper surfaces of a plurality of light-emitting elements in the bonding of the at least one first light-transmissive member to the upper surface of the light-emitting element, and
wherein the area of the upper surface of the second light-transmissive member is smaller than a total area of the upper surfaces of the plurality of light-emitting elements.

14. A method of manufacturing a light-emitting device, the method comprising:
providing:
at least one light-emitting element including an upper surface and at least one lateral surface,
at least one first light-transmissive member containing a wavelength conversion member and including an upper surface, at least one lateral surface, and a lower surface that has an area larger than an area of the upper surface of the light-emitting element, and
a second light-transmissive member including a lower surface that has an area larger than an area of the upper surface of the first light-transmissive member and including an upper surface having an area smaller than an area of the upper surface of the light-emitting element;
directly bonding the upper surface of the first light-transmissive member and the lower surface of the second light-transmissive member;
directly bonding the lower surface of the first light-transmissive member and the upper surface of the light-emitting element such that a periphery of the lower surface of the first light-transmissive member is located outward of a periphery of the upper surface of the light-emitting element;
disposing a second light-guiding member over the at least one lateral surface of the first light-transmissive member and a periphery of the lower surface of the second light-transmissive member; and
disposing a first light-guiding member over the at least one lateral surface of the light-emitting element and the periphery of the lower surface of the first light-transmissive member.

15. The method of manufacturing a light-emitting device according to claim 14, further comprising flip-chip bonding the light-emitting element to a substrate after disposing the first light-guiding member and the second light-guiding member.

16. The method of manufacturing a light-emitting device according to claim 14, further comprising disposing a light-reflective member to cover the at least one lateral surface of the second light-transmissive member, at least one lateral surface of the second light-guiding member, and at least one lateral surface of the first light-guiding member after disposing the first light-guiding member and the second light-guiding member.

17. The method of manufacturing a light-emitting device according to claim 14, wherein the first light-transmissive member and the second light-transmissive member comprise borosilicate glass, sapphire glass, or quartz glass.

18. The method of manufacturing a light-emitting device according to claim 14,
- wherein the lower surface of the at least one first light-transmissive member and upper surfaces of a plurality of light-emitting elements are directly bonded in the direct bonding of the lower surface of the at least one first light-transmissive member to the upper surface of the light-emitting element, and
- wherein the area of the upper surface of the second light-transmissive member being smaller than a total area of the upper surfaces of the plurality of light-emitting elements.

* * * * *